(12) United States Patent
Lin et al.

(10) Patent No.: US 12,363,924 B2
(45) Date of Patent: Jul. 15, 2025

(54) SEMICONDUCTOR DEVICES AND METHODS FOR FABRICATION THEREOF

(71) Applicant: TAIWAN SEMICONDUCTOR MANUFACTURING COMPANY, LTD., Hsinchu (TW)

(72) Inventors: Jen-Po Lin, Hsinchu (TW); Cherng-Yu Wang, Hsinchu (TW); Hsiao-Kuan Wei, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 17/829,717

(22) Filed: Jun. 1, 2022

(65) Prior Publication Data

US 2023/0395647 A1    Dec. 7, 2023

(51) Int. Cl.
*H10D 1/68* (2025.01)
*H10D 1/00* (2025.01)

(52) U.S. Cl.
CPC .............. *H10D 1/696* (2025.01); *H10D 1/042* (2025.01); *H10D 1/043* (2025.01); *H10D 1/68* (2025.01); *H10D 1/716* (2025.01)

(58) Field of Classification Search
CPC . H01L 23/5223; H01L 23/5283; H01L 28/60; H01L 28/86–87; H01L 28/90–91; H01L 21/022; H10D 1/696; H10D 1/042; H10D 1/043; H10D 1/716
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 11,139,286 B2 * | 10/2021 | Ding | H01L 28/20 |
| 11,309,383 B1 | 4/2022 | Choi et al. | |
| 2015/0311273 A1 | 10/2015 | Lin et al. | |
| 2019/0229053 A1 * | 7/2019 | Hung | H01L 21/76852 |
| 2021/0091169 A1 * | 3/2021 | Lin | H10B 61/10 |
| 2022/0139820 A1 | 5/2022 | Liang et al. | |

FOREIGN PATENT DOCUMENTS

| | | |
|---|---|---|
| CN | 111211092 A | 5/2020 |
| CN | 113594365 A | 11/2021 |

* cited by examiner

*Primary Examiner* — Jose R Diaz
(74) *Attorney, Agent, or Firm* — NZ Carr Law Office

(57) ABSTRACT

Embodiments of present disclosure provide a MIM capacitor including a straining layer on an electrode, and a high-k dielectric layer formed on the straining layer. The straining layer allows the high-k dielectric layer to be highly crystallized without requiring an extra annealing process. The high crystallization of the high-k dielectric layer results in increased the dielectric value (k-value), thus, improving capacitance density in the MIM capacitor. Some embodiments provide a MIM capacitor device including stacked MIM capacitors with symmetrically arranged high-k dielectric layers and straining layers.

20 Claims, 47 Drawing Sheets

SEMICONDUCTOR DEVICES AND METHODS FOR FABRICATION THEREOF

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Many of the ICs involve capacitive structures to store a charge in a variety of semiconductor devices. Such capacitive structures include, for example, metal-oxide-semiconductor (MOS) capacitors, p-n junction capacitors, and metal-insulator-metal (MIM) capacitors. MIM capacitors can be used in mixed signal devices and logic devices, such as embedded memories and radio frequency devices. MIM capacitors exhibit improved frequency and temperature characteristics. Furthermore, MIM capacitors are formed in or over the metal interconnect layers, thereby reducing CMOS transistor process integration interactions or complications.

%

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
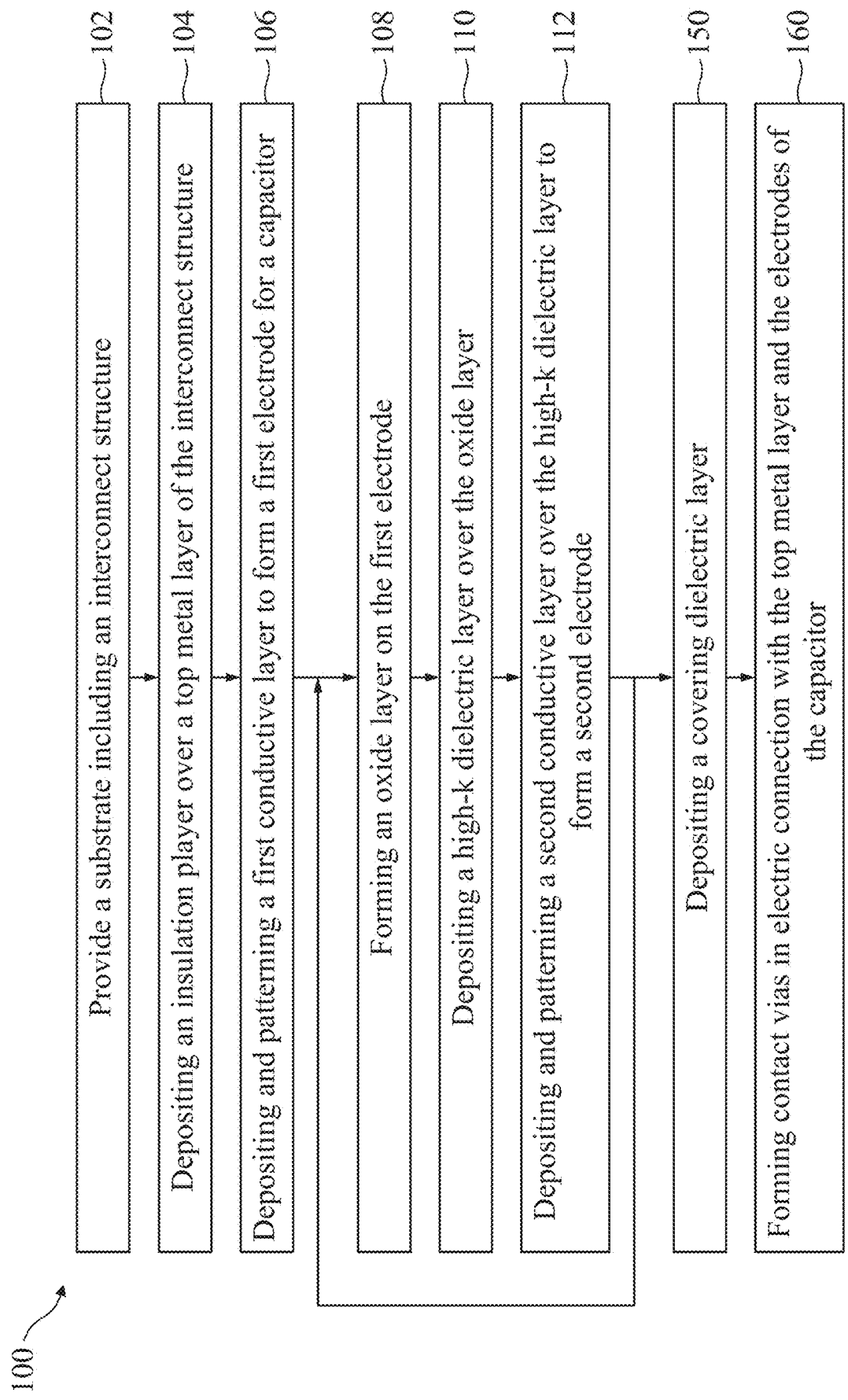
FIG. 1 is a flow chart of a method for fabricating a metal-insulator-metal (MIM) capacitor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of present disclosure relate to MIM capacitor devices and methods of manufacturing the MIM capacitor devices. Some embodiments provide a MIM capacitor including a straining layer formed on an electrode, and a high-k dielectric layer as an insulator layer formed on the straining layer. The straining layer allows the insulator layer to be highly crystallized without requiring an extra annealing process. The high crystallization of the insulator layer or the high-k dielectric layer results in increased dielectric value (k-value), thus, improving capacitance density in the MIM capacitor. Some embodiments provide a MIM capacitor device including stacked MIM capacitors with symmetrically arranged insulator layers and straining layers.

FIG. 1 is a flow chart of a method 100 for fabricating a MIM capacitor device according to embodiments of the present disclosure. FIGS. 2A-B, 3-4, 5A-C, 6A-C, 7A-C, 8, 9A-9C, 10-16, and 17A-C schematically illustrate a MIM capacitor device 200 at various stages of fabrication according to the method 100 of FIG. 1.

In some embodiments, the MIM capacitor device 200 fabricated according to the method 100 may be a memory element of a resistive random-access memory (RRAM) cell and/or of a suitable type of various non-volatile computer memory cells. It is understood that additional steps can be provided before, during, and/or after the method 100, and some of the steps described can be replaced, eliminated, and/or moved around for additional embodiments of the method 100.

Figure 2A:
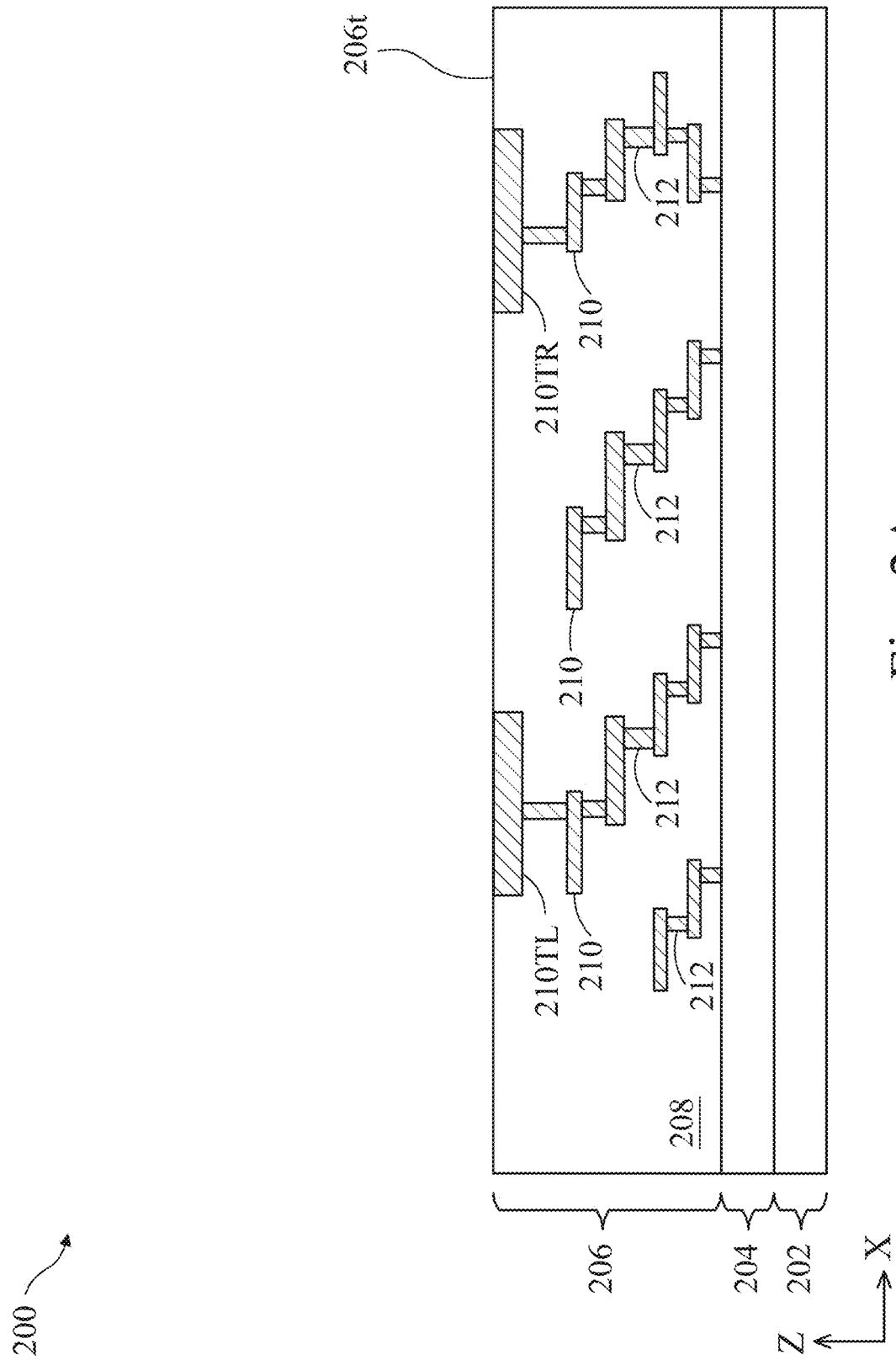
FIGS. 2A-B, 3-4, 5A-C, 6A-C, 7A-E, 8, 9A-9C, 10-16, and 17A-C schematically illustrate a metal-insulator-metal (MIM) capacitor device at various stages of fabrication according to the method of FIG. 1.
Figure 2B:
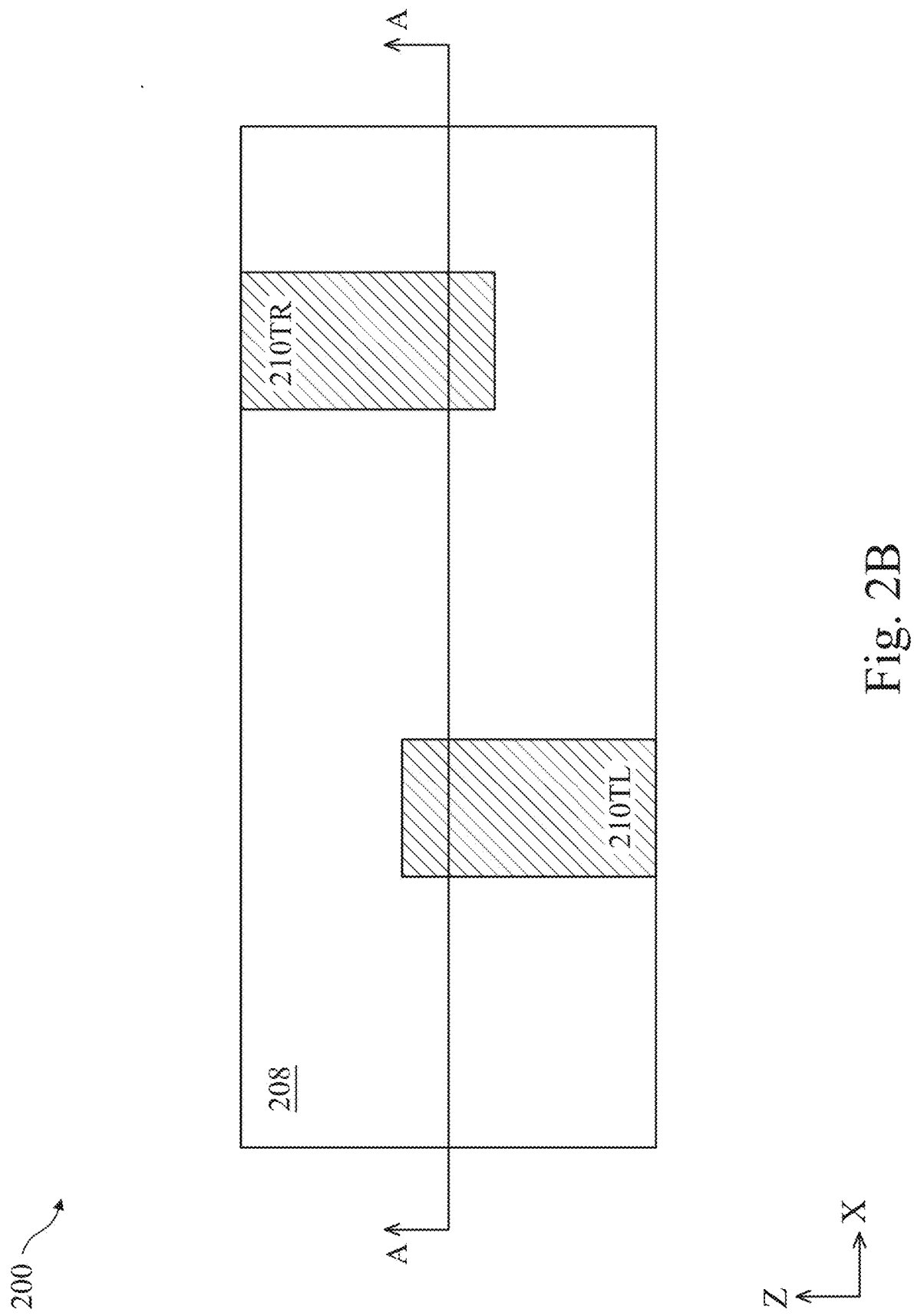

At operation 102 of the method 100, a substrate 202 is provided, as shown in FIGS. 2A and 2B. FIG. 2B is a top view of the device 200 at operation 102. FIG. 2A is a schematic cross-sectional view along the A-A line in FIG. 2B. MIM capacitors are subsequently formed on the substrate 202 in a back-end-of-line (BEOL) process. In some embodiments, the substrate 202 includes a device layer 204 formed in and/or on a front side of the substrate 202. An interconnect structure 206 is formed on the device layer 204. MIM capacitors may be formed on and within the interconnect structure 206.

In some embodiments, the substrate 202 may be a semiconductor substrate, such as a bulk semiconductor, a semiconductor-on-insulator (SOI) substrate, or the like, which may be doped, for example, with P-type or N-type dopants, or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may further include isolation features (not shown), such as shallow trench isolation (STI) features or local oxidation of silicon (LOCOS) features. Isolation features may surround and isolate various device elements in the device layer 204.

The device layer 204 includes device elements formed in and/or on the substrate 202. Device elements may include transistors, such as metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc., diodes, and/or other applicable elements. In some embodiments, the device elements are formed in the substrate 202 in a front-end-of-line (FEOL) process.

The interconnect structure 206 includes various conductive features, such as a first plurality of conductive features 210 and second plurality of conductive features 212, and an intermetal dielectric (IMD) layer 208 to separate and isolate various conductive features 210, 212. In some embodiments, the first plurality of conductive features 210 are conductive lines and the second plurality of conductive features 212 are conductive vias. The interconnect structure 206 includes multiple levels of the conductive features 210, and the conductive features 210 are arranged in each level to provide electrical paths to various device elements in the device layer 204 disposed below. The conductive features 212 provide vertical electrical routing from the device layer 204 to the conductive features 210 and between conductive features 210. For example, the bottom-most conductive features 212 of the interconnect structure 206 may be electrically connected to the conductive contacts disposed over source/drain regions and gate electrodes of transistors in the device layer 204.

The IMD layer 208 includes one or more dielectric materials to provide isolation functions to various conductive features 210, 212. The IMD layer 208 may include multiple levels embedding multiple levels of conductive features 210, 212. A level of the interconnect structure 206 may be a layer of the IMD layer 208. The layers are sometimes referred to as M1, M2, . . . M10, M11, et, with M1 being closest to the device layer 204. In some embodiments, the conductive features 210 on the topmost IMD layer are referred to as top metal and denoted as conductive features 210TL, 210TR.

The IMD layer 208 may be made from a dielectric material, such as SiOx, SiOxCyHz, SiOCN, SiON, or SiOxCy, where x, y and z are integers or non-integers. In some embodiments, the IMD layer 208 includes a low-k dielectric material having a k-value less than that of silicon dioxide. In some embodiments, the IMD layer 208 may include etch stop layers between levels of low-k dielectric material layers to facilitate patterning and formation of the conductive features 210, 212. The etch stop layers may be made of silicon carbide (SIC), silicon nitride (SixNy), silicon carbonitride (SiCN), silicon oxycarbide (SiOC), silicon oxycarbon nitride (SiOCN), tetraethoxysilane (TEOS) or another applicable material.

The conductive features 210 and conductive features 212 may be made from one or more electrically conductive materials, such as metal, metal alloy, metal nitride, or silicide. For example, the conductive features 210 and the conductive features 212 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof. In some embodiments, a barrier layer, not shown, may be formed between the IMD layer 208 and the conductive features 210, 212 to prevent diffusion of the conductive features 210, 212 to the dielectric material in the IMD layer 208. The barrier layer may be made of titanium (Ti), titanium alloy, tantalum (Ta) or tantalum alloy. For example, the barrier layer may be made of tantalum nitride (TaN).

In some embodiments, a planarization process, a chemical mechanical polishing (CMP) process, and/or a cleaning process may be performed to expose the topmost conductive features 210T prior to forming the MIM capacitors. Two topmost conductive features 210TL and 210TR are shown and to connect with electrodes of the capacitors to be formed. As shown in FIG. 2B, the topmost conductive features 210TL and 201TR are exposed on a top surface 206t of the interconnect structure 206.

Figure 3:
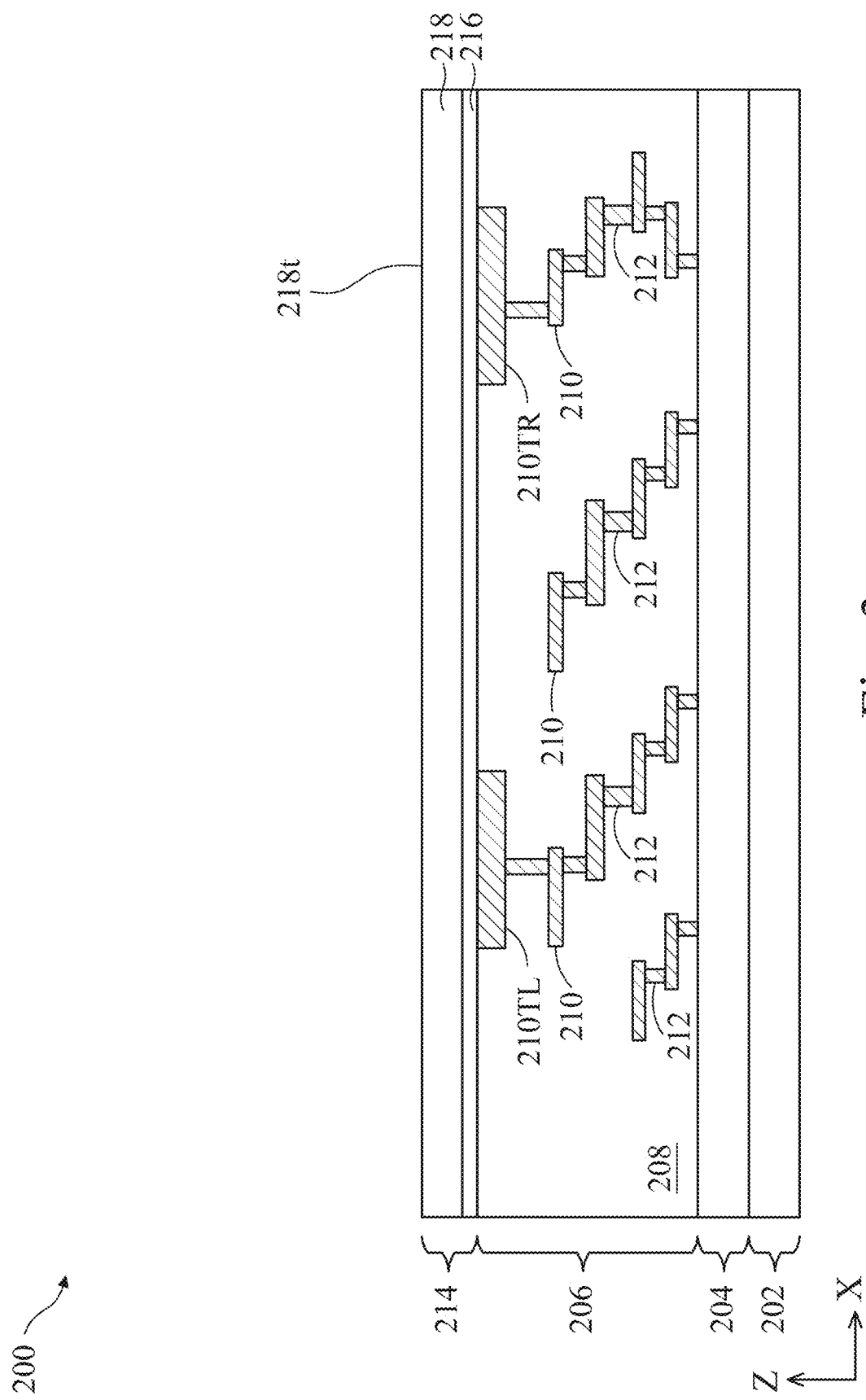

At operation 104, an insulation layer 214 is formed over the interconnect structure 206 as shown in FIG. 3, which is a schematic sectional view of the device 200. In some embodiments, the insulation layer 214 may include an etch stop layer 216 and a dielectric layer 218 sequentially deposited over the interconnect structure 206.

The etch stop layer 216 may include silicon carbide (SIC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, the etch stop layer 216 may be formed by performing a plasma enhanced chemical vapor deposition (CVD) process, a low-pressure CVD process, an atomic layer deposition (ALD) process, or another applicable process.

The dielectric layer 218 may include undoped silicate glass (USG), fluorinated silicate glass (FSG), carbon-doped silicate glass, silicon oxide, silicon nitride or silicon oxynitride. In some embodiments, the dielectric layer 218 may be formed by a chemical vapor deposition (CVD) process, a spin-on process, a sputtering process, or a combination thereof. In some embodiments, the thickness of the dielectric layer 218 is in a range from about 3000 Å to about 5000 Å.

Figure 4:
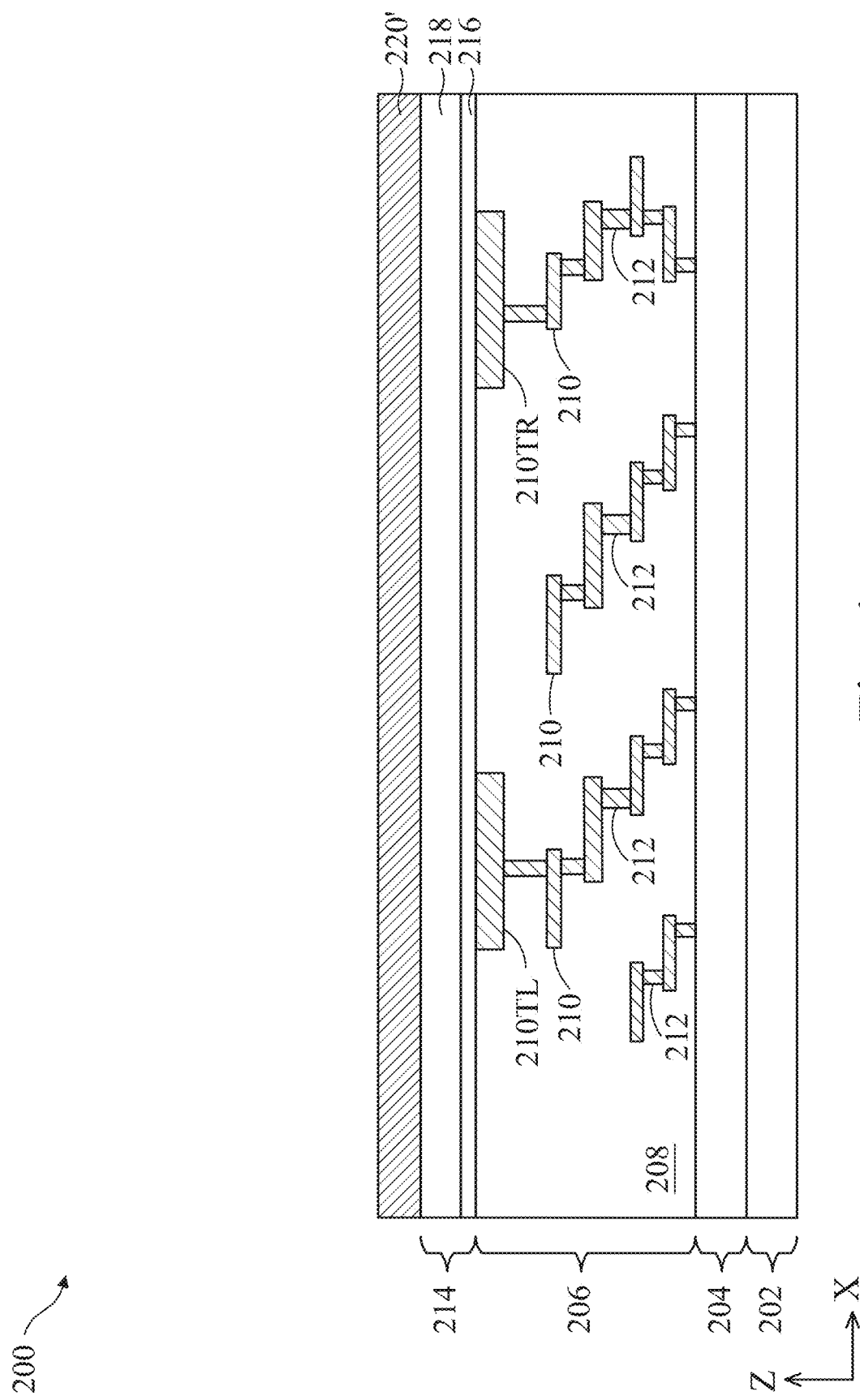
Figure 5A:
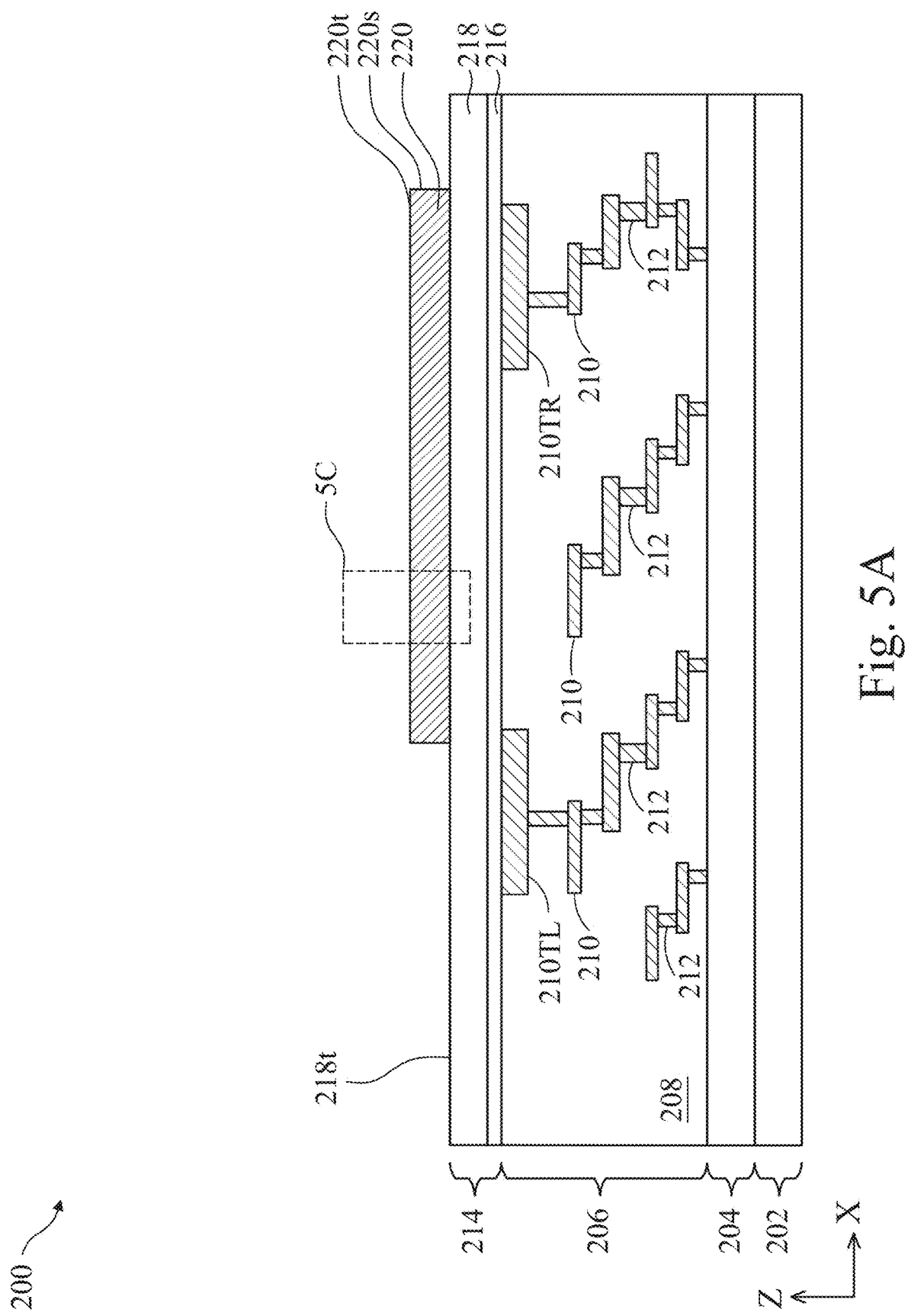
Figure 5B:
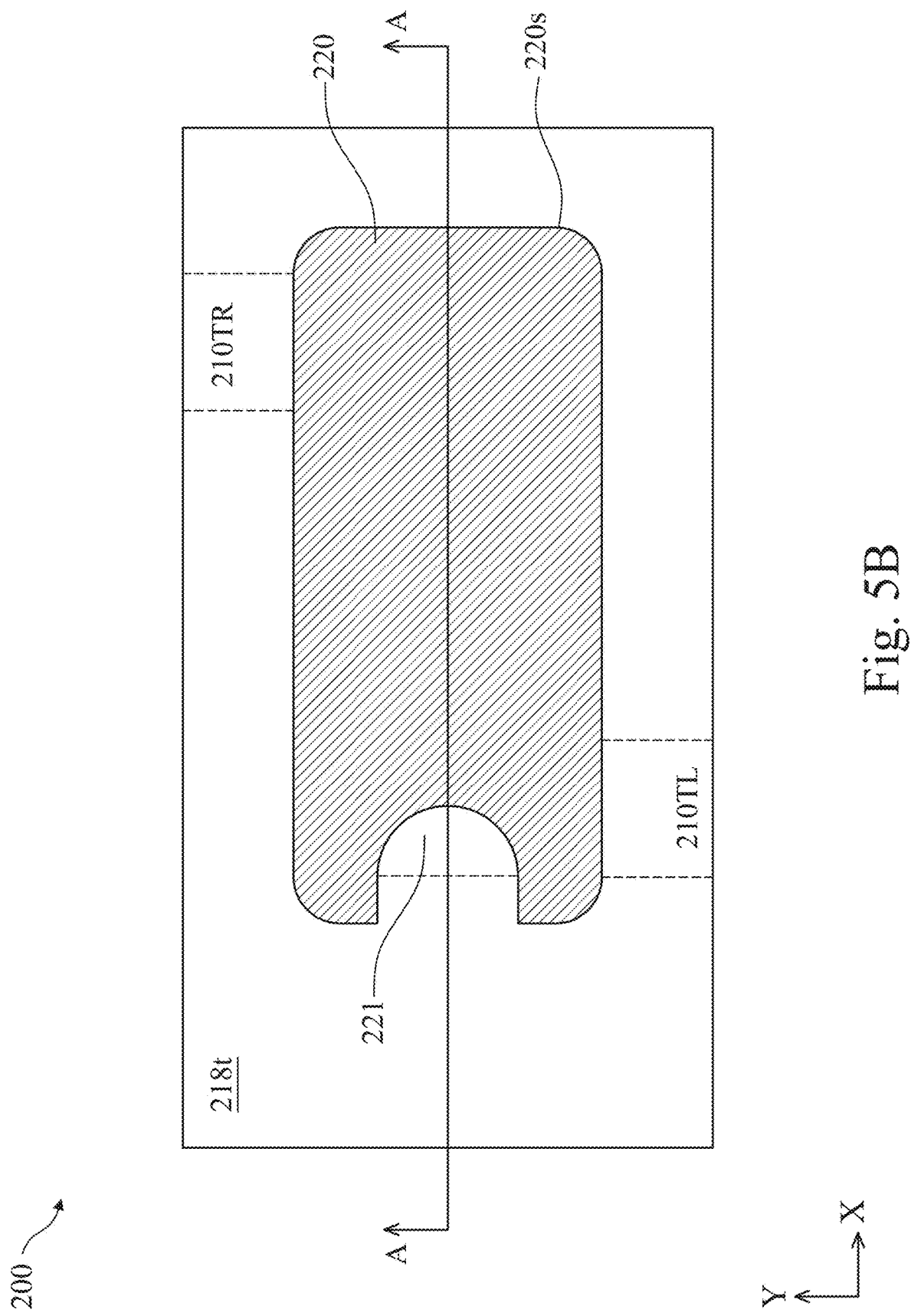

At operation 106, a first electrode 220 is formed by depositing and patterning a conductive layer 220' as shown in FIGS. 4, 5A, 5B, and 5C. The conductive layer may be conformally deposited on a top surface 218t of the dielectric layer 218, as shown in FIG. 4, and then patterned to form a desired shape corresponding to design of the capacitor to be formed, as shown in FIGS. 5A and 5B.

The conductive layer 220' (first electrode 220) may be formed from a suitable conductive material. In some embodiments, the first electrode 220 is formed from a material with a columnar crystalline texture across the thickness or along the z-direction. In some embodiments, the first electrode 220 may include a metal nitride. In some embodiments, the first electrode 220 includes a transitional metal nitride having a columnar crystalline texture, such as a titanium nitride (TiN), tantalum nitride (TaN), molybdenum nitride (MoN), or a combination thereof. In some embodiments, the conductive layer may be formed by performing a deposition process, for example, a physical vapor deposition (PVD) process, a CVD process, or an atomic layer deposition (ALD) process. In some embodiments, a PVD process is used to form columnar textures.

The conductive layer may be patterned by conducting a photolithography process, a maskless lithography process, or a variety of processes suitable for transferring a pattern to the conductive layer. The first electrode 220 may be formed in a variety of shapes in the x-y plane, for example a circle, a curvilinear shape, a rectangle, a line, a polygon including with rounded corners, and/or other suitable shapes. In some embodiment, the first electrode 220 covers an area which overlaps the topmost conductive feature 210TR and excludes the topmost conductive feature 210TL. In the example of FIG. 5B, the first electrode 220 has a substantially rectangular shape with an opening 221 to allow a vertical contact of the opposing electrode to pass and connect to the conductive feature 210TL.

A top surface 220t of the first electrode 220 is to function as an interface to the insulator of a capacitor to be formed. The top surface 220t is substantially parallel to the top surface 218t of the dielectric layer 218. The first electrode 220 has sidewalls 220s connecting the top surface 220t to the top surface 218t of the dielectric layer 218.

Figure 5C:
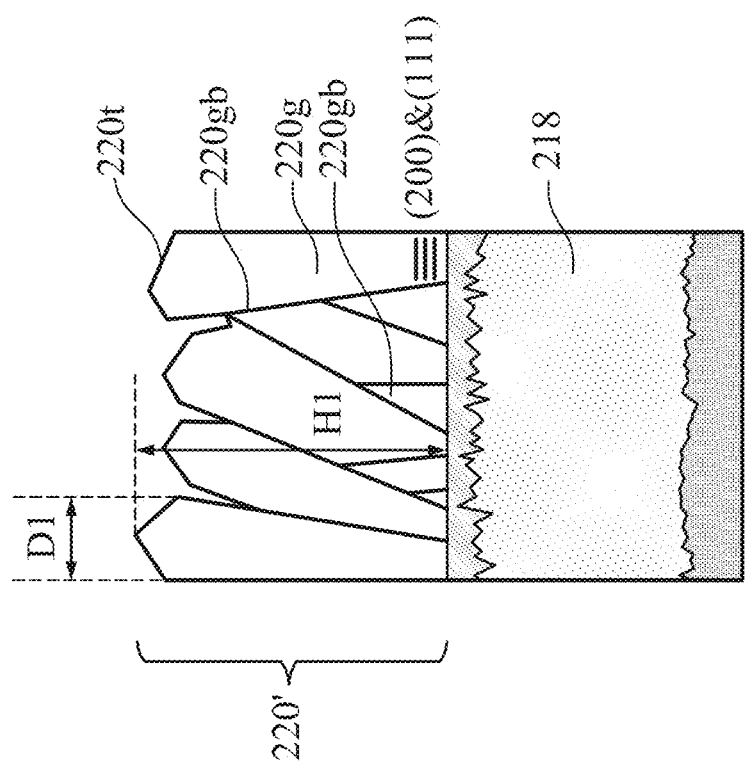

FIG. 5C is a schematic partial enlarged view of area 5C in FIG. 5A. As shown in FIG. 5C, the first electrode 220 has substantially columnar crystal grains 222g. In some embodiments, the columnar crystal grain 222g of the first electrode 220 may grow on lattice surface (200) & (111). Grain boundaries 222gb in the first electrode 220 are substantially along the z-direction. In some embodiments, the crystal columnar grains 222g may be shaped substantially has a column having a height H1 along the z-direction and a diameter D. The height H1 may be selected according to target thickness the electrode for the capacitor. In some embodiments, the thickness T1 may be in a range between about 15 nm and about 60 nm. The diameter D1 may be in a range between 12 nm to 14 nm. As shown in FIG. 5C, the top surface 220t of the first electrode 220 may be uneven with nano domes.

Figure 6A:
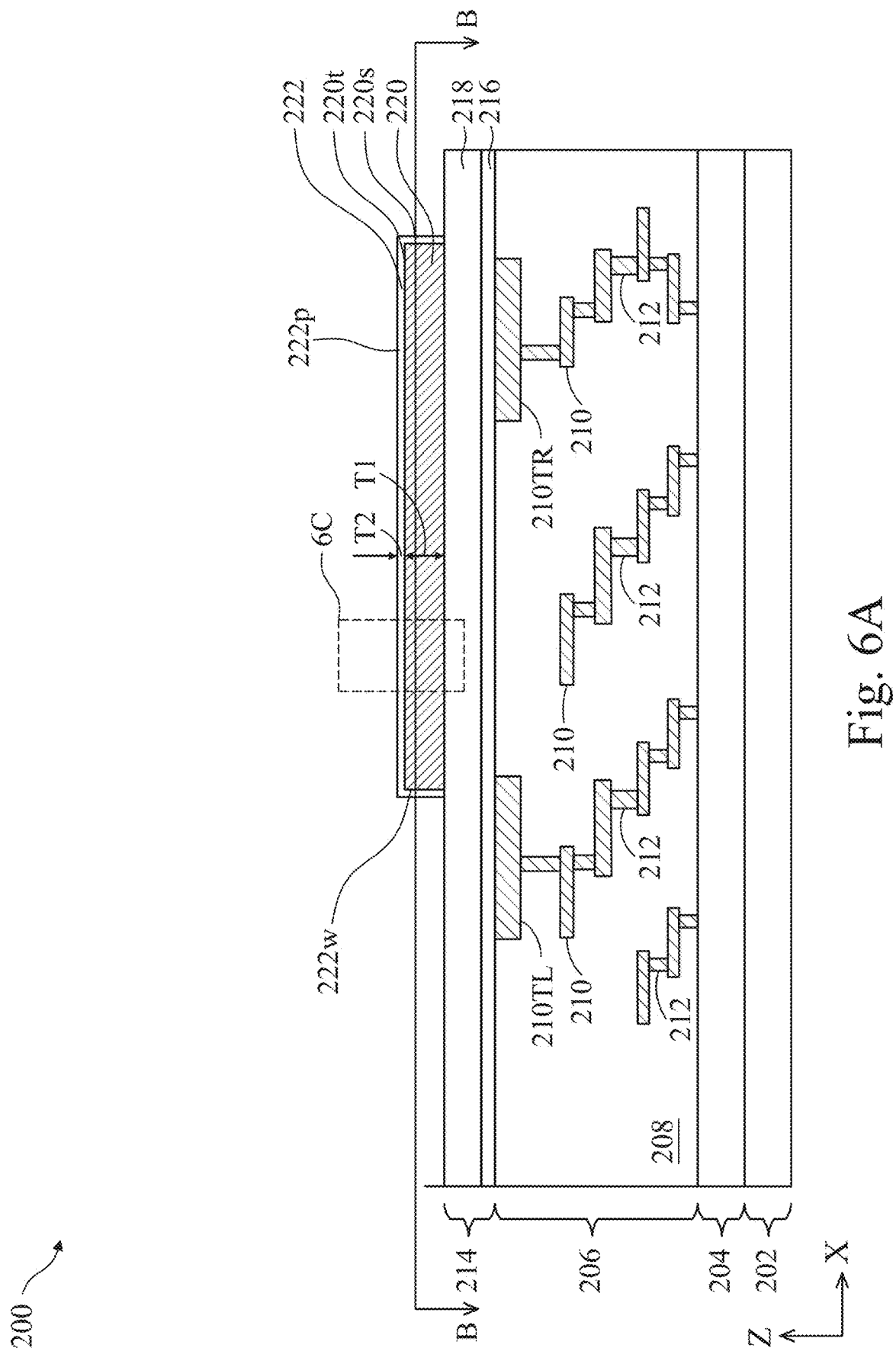
Figure 6B:
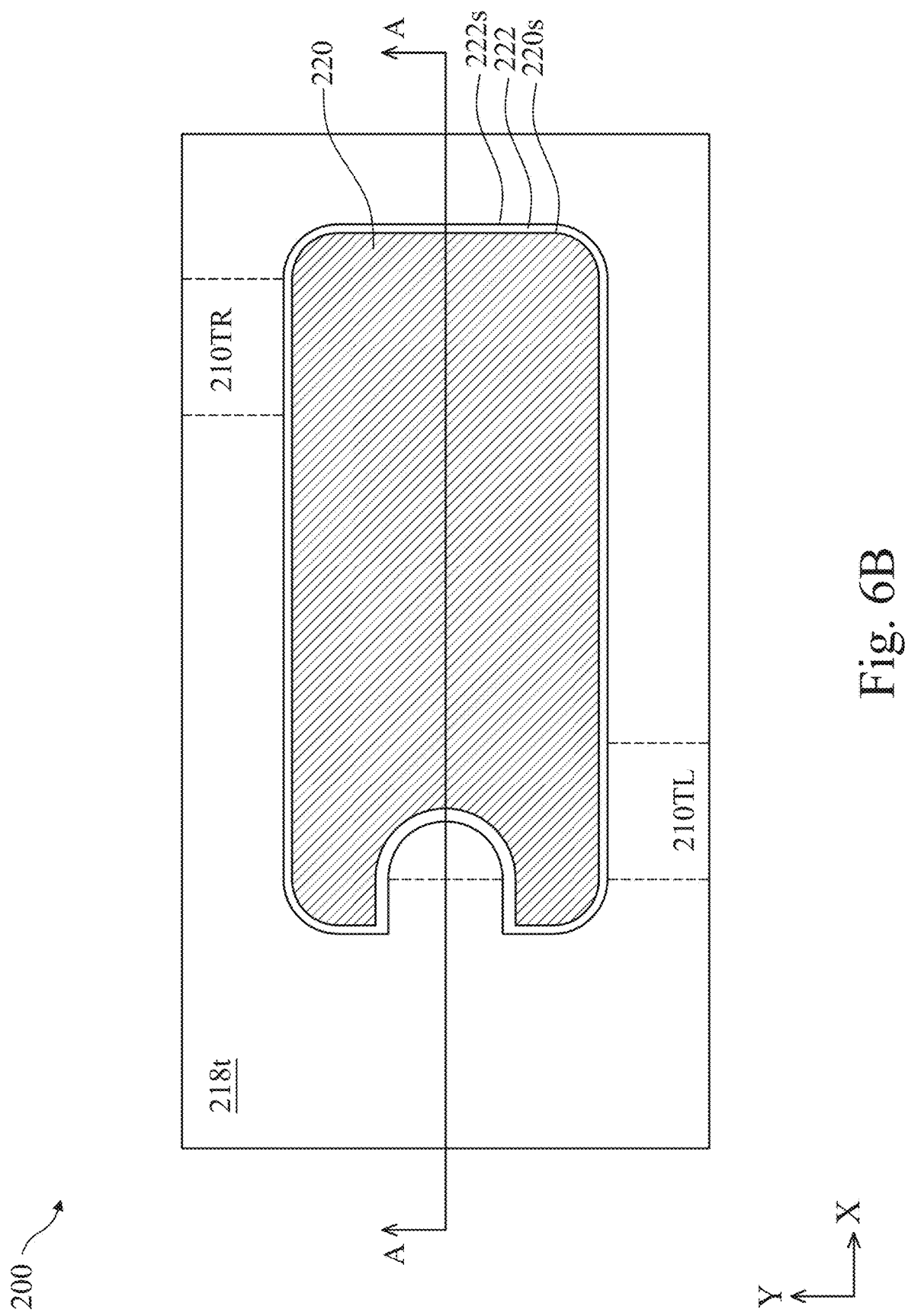
Figure 6C:
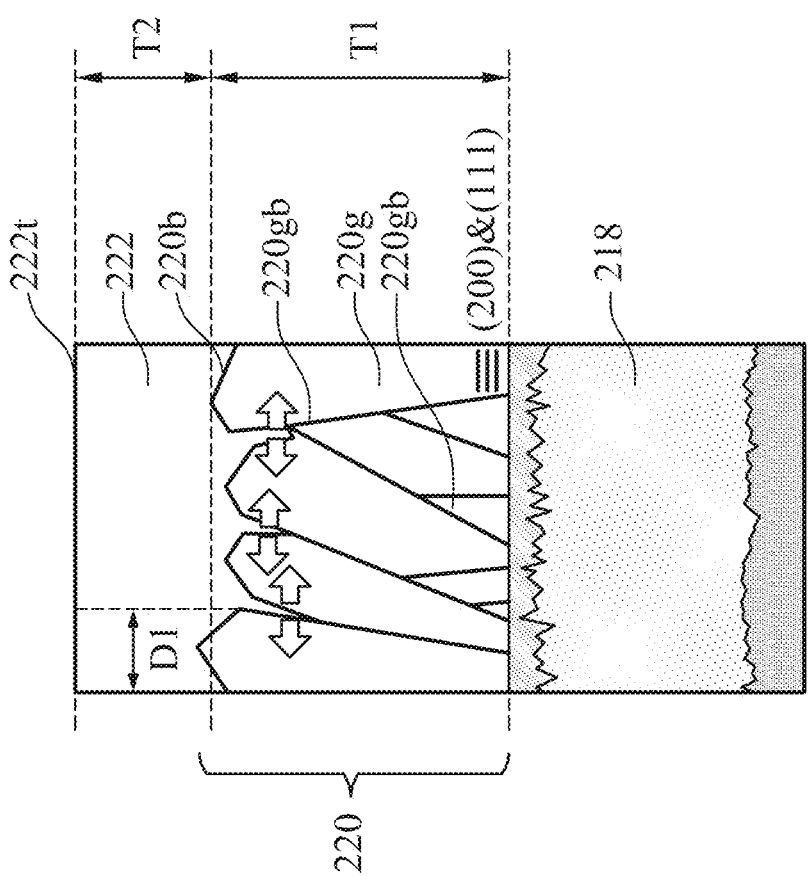

At operation 108, a straining layer 222 is formed on the first electrode 220, as shown in FIGS. 6A, 6B, and 6C. The straining layer 222 is formed on exposed surfaces of the first electrode 220 by treating the first electrode 220 with a source of small atoms. The straining layer 222 may include a material with a lattice structure suitable to grow a highly crystalized high-k dielectric material thereon.

In some embodiments, the straining layer 222 covers the top surface 220t and sidewalls 220s of the first electrode 220. As shown in FIG. 6B, the straining layer 222 may include a planar portion 222p formed on the top surface 220t and a wall portion 222w formed on sidewalls 220s of the first electrode 220. The straining layer 222 may be formed in and on the electrode 220, for example, the straining layer 222 is formed from the grain boundary 220gb of the first electrode 220. The straining layer 222, particularly the planar portion 222p, increases intragranular strain in the first electrode 220.

In some embodiments, the straining layer 222 may be formed by introducing smaller atoms to a top portion of the first electrode 220, thereby, introducing strain to the first electrode 220. For example, the straining layer 222 may be formed by introducing oxygen, and/or hydrogen atoms to the first electrode 220 through the top surface 220t and sidewall 220s of the first electrode 220. For example, the first electrode 220 may be exposed to an oxygen source or a hydrogen source.

In some embodiments, the straining layer 222 may include an oxide of the conductive material in the first electrode 220. For example, the straining layer 222 may comprise a metal oxynitride of a transition metal, such as TiON, TaON, MoON, and a combination. The straining layer 222 may be formed by oxidation process, such as plasma oxidation, wet process oxidation, or natural oxidation.

In some embodiments, the straining layer 222 is formed by exposing the first electrode 220 to an oxygen containing plasma, such as $N_2O$ plasma, and $N_2/O_2$ plasma, or the similar. In some embodiments, the straining layer 222 is formed by exposing the first electrode 220 to a wet processing solution, such as s solution comprising sodium hydroxide (NaOH), sulfuric acid ($H_2SO_4$), potassium hydroxide (KOH), sodium carbonate ($Na_2CO_3$), sodium nitrite ($NaNO_2$), and urea $[CO(NH_2)_2]$ or similar. In some embodiments, the straining layer 222 is formed by a wet oxidization process followed by a plasma oxidation.

In some embodiments, the straining layer 222 is formed to obtain a degree of intragranular strain in the first electrode 220. For example, after formation of the straining layer 222, the first electrode 220 has a degree of in-plane intragranular strain greater than 0.5%, for example in a range between about 0.5% and 1.0%. If the degree of intragranular strain in the first electrode 220 is less than 0.5%, the strain may not be sufficient to improve crystallinity of the subsequently formed high-k dielectric layer. If the degree of intragranular strain in the first electrode 220 is greater than 1.0%, the strain may reduce structural integrity without provide additional benefit.

FIG. 6C is a schematic partial enlarged view of area 6C in FIG. 6A. As shown in FIG. 6C, the straining layer 222 is formed between grain boundaries 220gb of the columnar crystal grain 220g of the first electrode 220. The strain within the grain 220g of the first electrode 220 may be measured by lattice constant shift inspected via in-plane XRD technique. For example, when the straining layer 222 is a layer of TiON formed by oxidation of TiN with columnar texture in the first electrode 220, the layer of TiON may create in-plane nano-strain on TIN grains at a degree of in-plane intragranular strain in a range between 0.1% to 1.0%.

After formation of the straining layer 222, the first electrode 220 has a thickness T1 along the z-direction. In some embodiments, the thickness T1 may be in a range between about 15 nm and about 60 nm. When the first electrode 220 is thinner than 15 nm, the resistance of the first electrode 220 may be too high to satisfy capacitor performance requirement. When the first electrode 220 is thicker than 60 nm, device dimension and cost of fabrication are increased without additional benefit in reduced resistance. In some embodiments, the straining layer 222 has a thickness T2. In some embodiments, a ratio of the thickness T2 over the thickness T1 may be in a range between 0.03 to 0.33. In some embodiments, the straining layer 222 has a thickness in a range between 2 nm to 5 nm. If the thickness T2 of the straining layer 222 is less than 2 nm, the strain may not be sufficient to improve crystallinity of the subsequently formed high-k dielectric layer. If the thickness T2 of the straining layer 222 is greater than 5 nm, the straining layer 222 may introduce a leaky capacitance that negatively affect the performance.

Figure 7A:
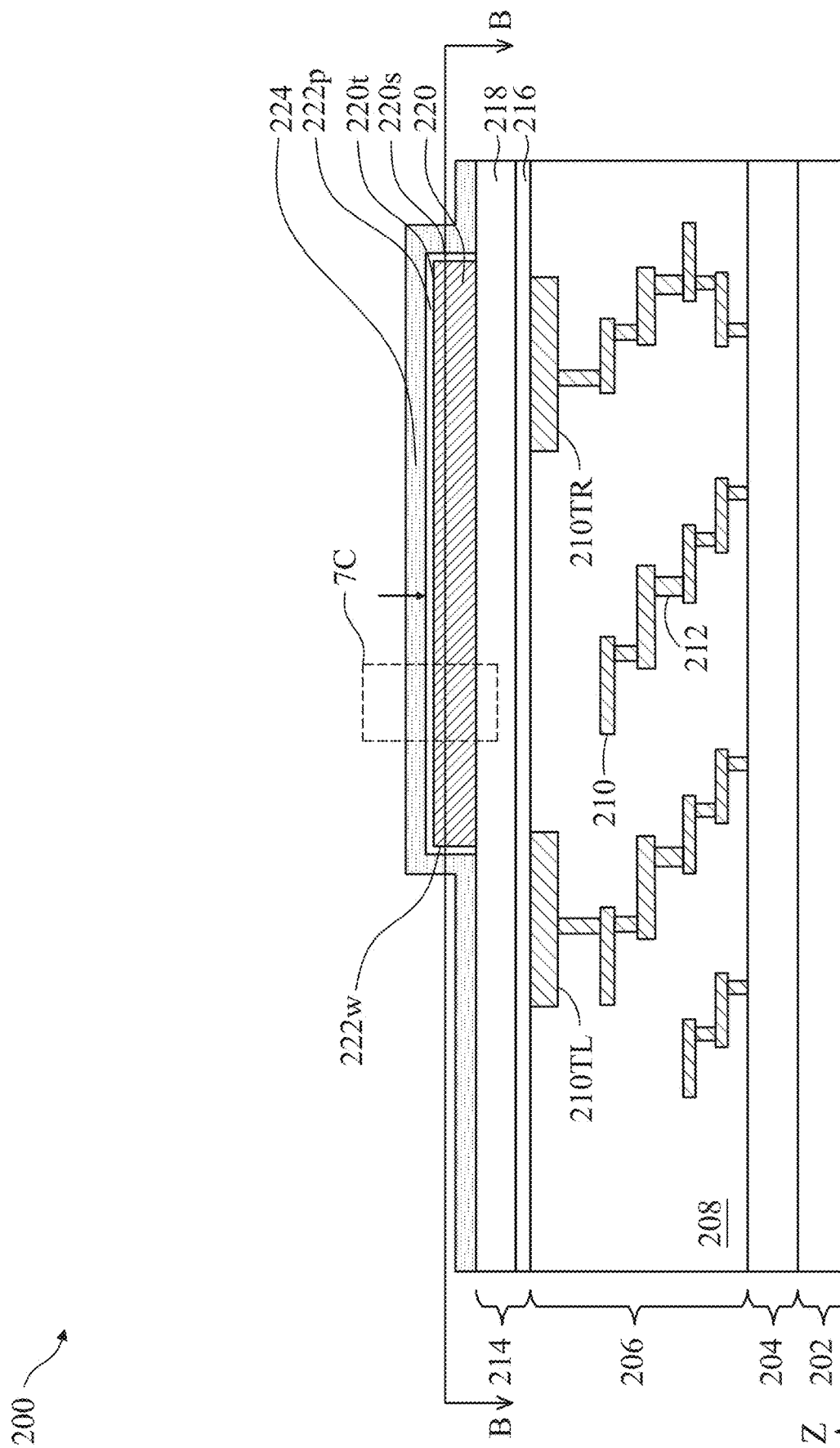
Figure 7B:
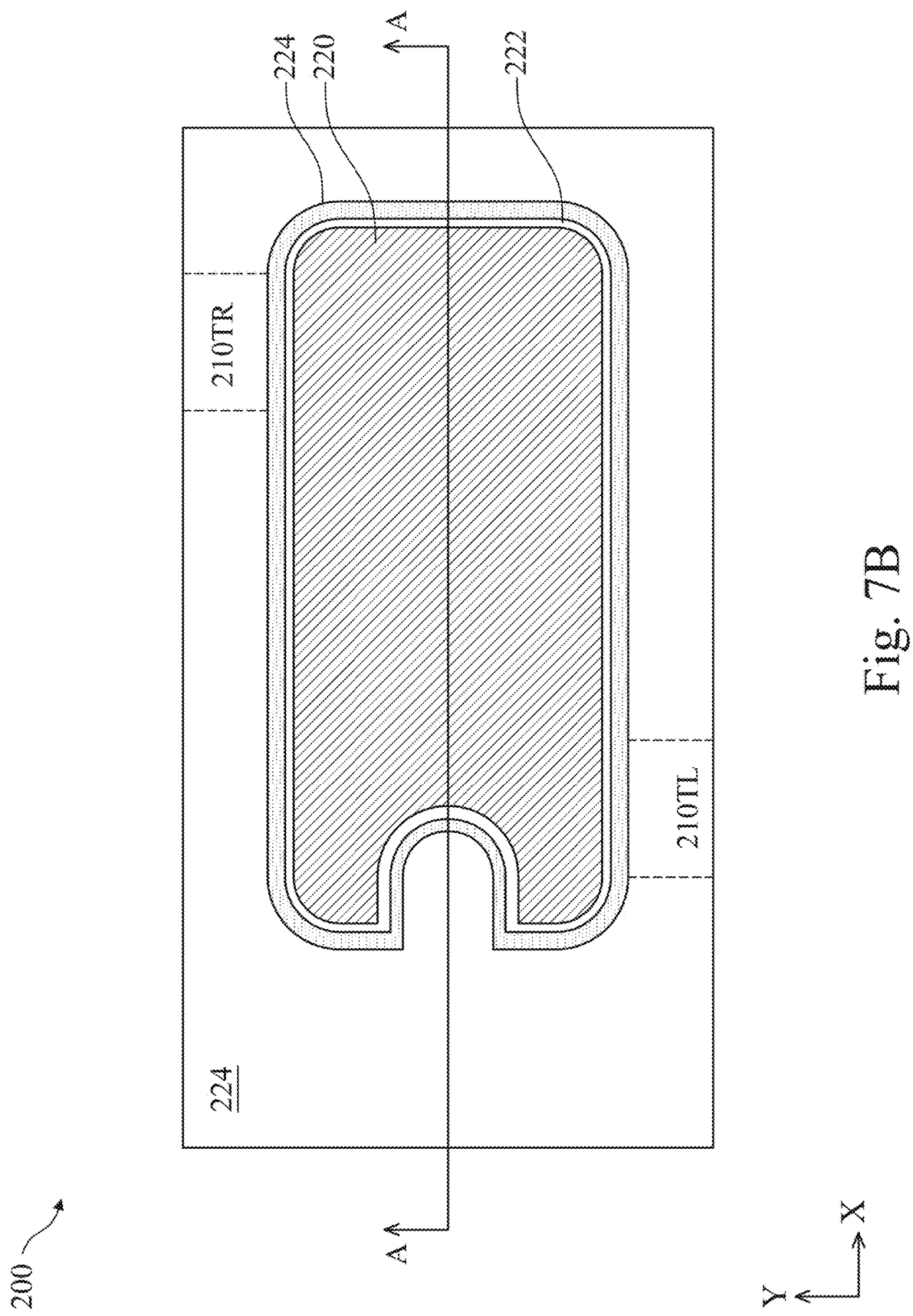

At operation 110, a high-k dielectric layer 224 is formed over the straining layer 222, as shown in FIGS. 7A-7E. The high-k dielectric layer 224, to function as an insulator of a capacitor, may be conformally formed over the exposed surfaces. As shown in FIGS. 7A and 7B, the high-k dielectric layer 224 is formed on the planar portion 222$p$ and the sidewall portions 222$w$ of the straining layer 222, and on the dielectric layer 218.

In some embodiments, the high-k dielectric layer 224 includes dielectric materials having a dielectric constant value great is in a range from about 10 to about 35. The high-k dielectric layer 224 may oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or another applicable material. Exemplary high-k dielectric materials for the high-k dielectric layer %224 may include $Al_2O_3$, $ZrO_2$, $Ta_2O_5$, $HfO_2$, $La_2O_3$, $TiO_2$, $SiO_2$, or a combination hereof. In some embodiments, the high-k dielectric layer 224 includes $HfO_2$, $ZrO_2$, $Hf_xZr_{1-x}O_2$ (0<x<1). In some embodiments, the high-k dielectric layer 224% is formed by performing a plasma enhanced chemical vapor deposition (CVD) process, a low-pressure CVD process, an atomic layer deposition (ALD) process, a molecular beam deposition (MBD) or another applicable process. The high-k dielectric layer 224 has a thickness T2. In some embodiments, the thickness T2 is in a range between about 2 nm to about 10 nm.

Figure 7C:
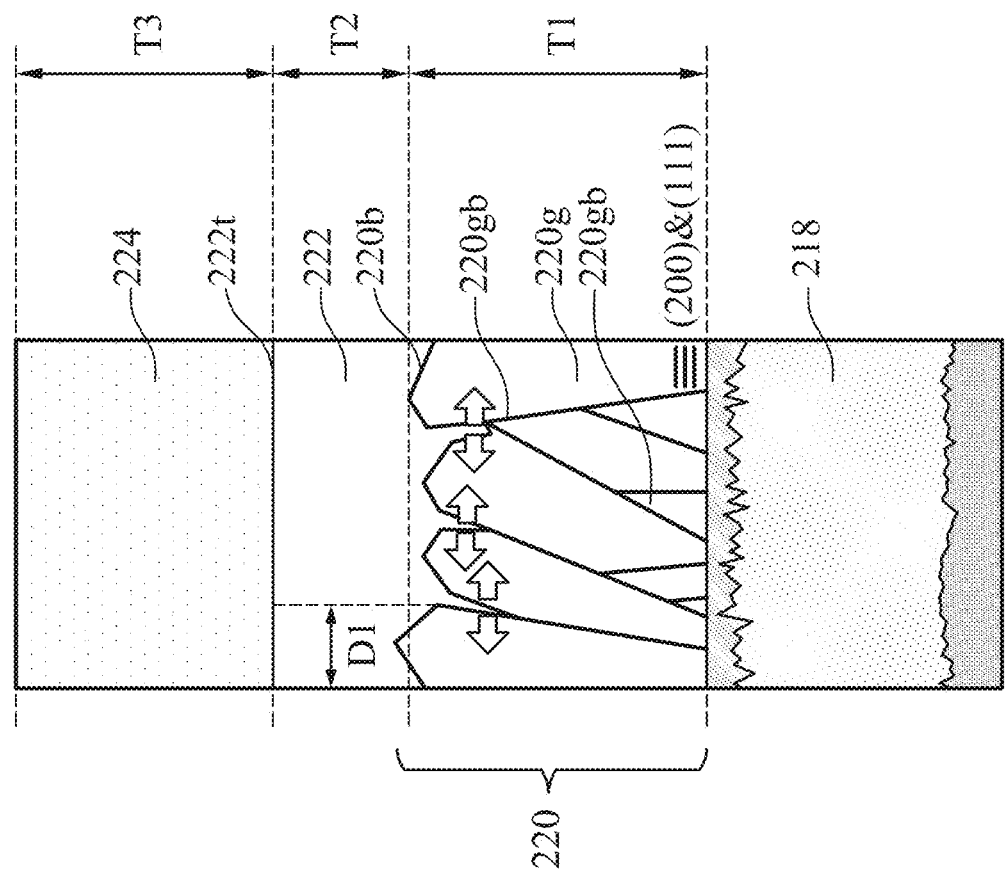
Figure 7D:
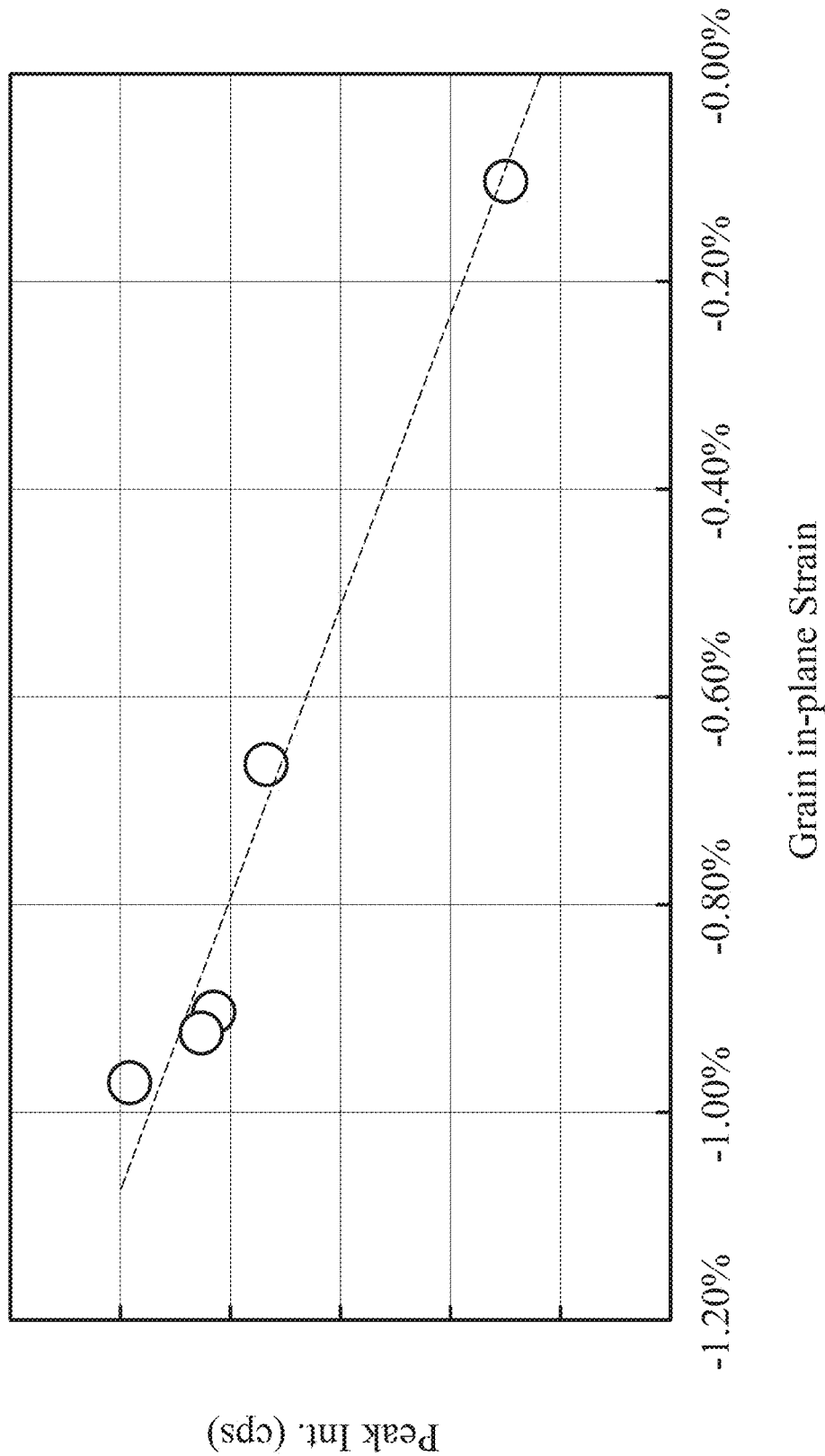
Figure 7E:
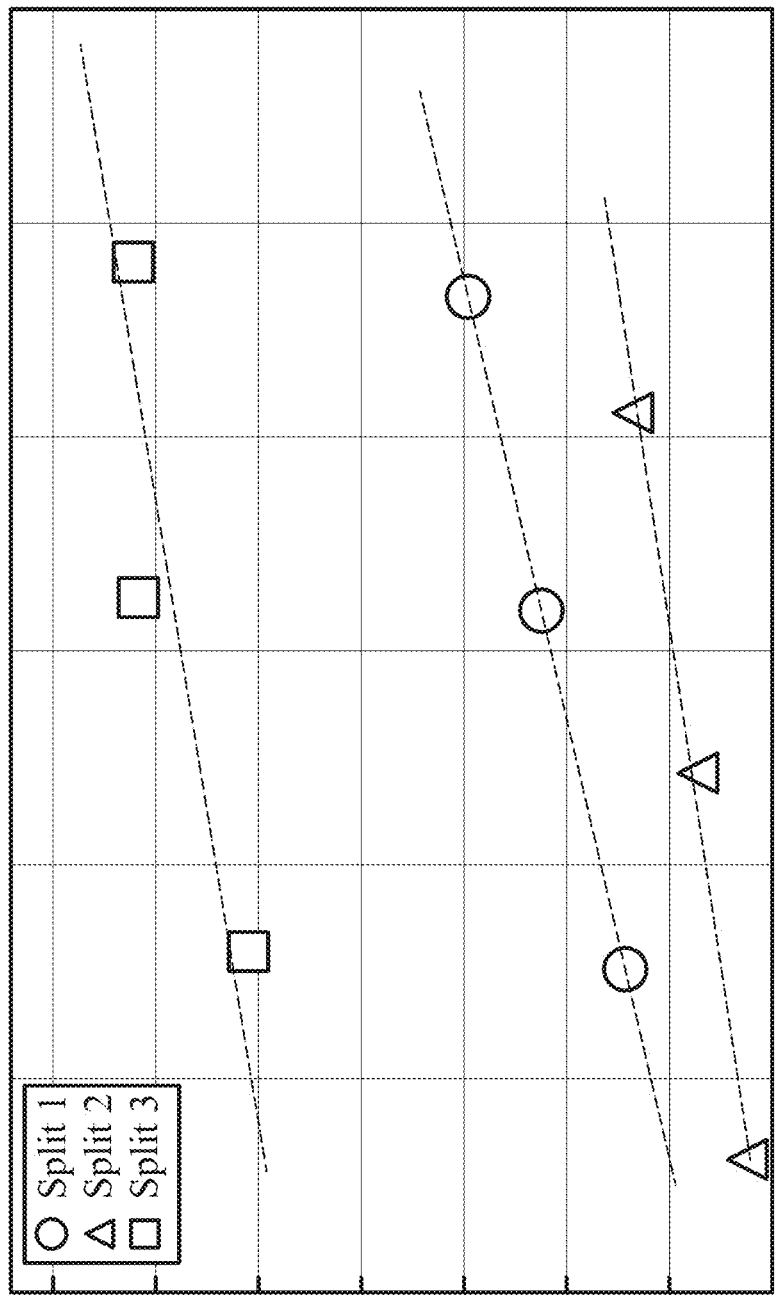
Figure 8:
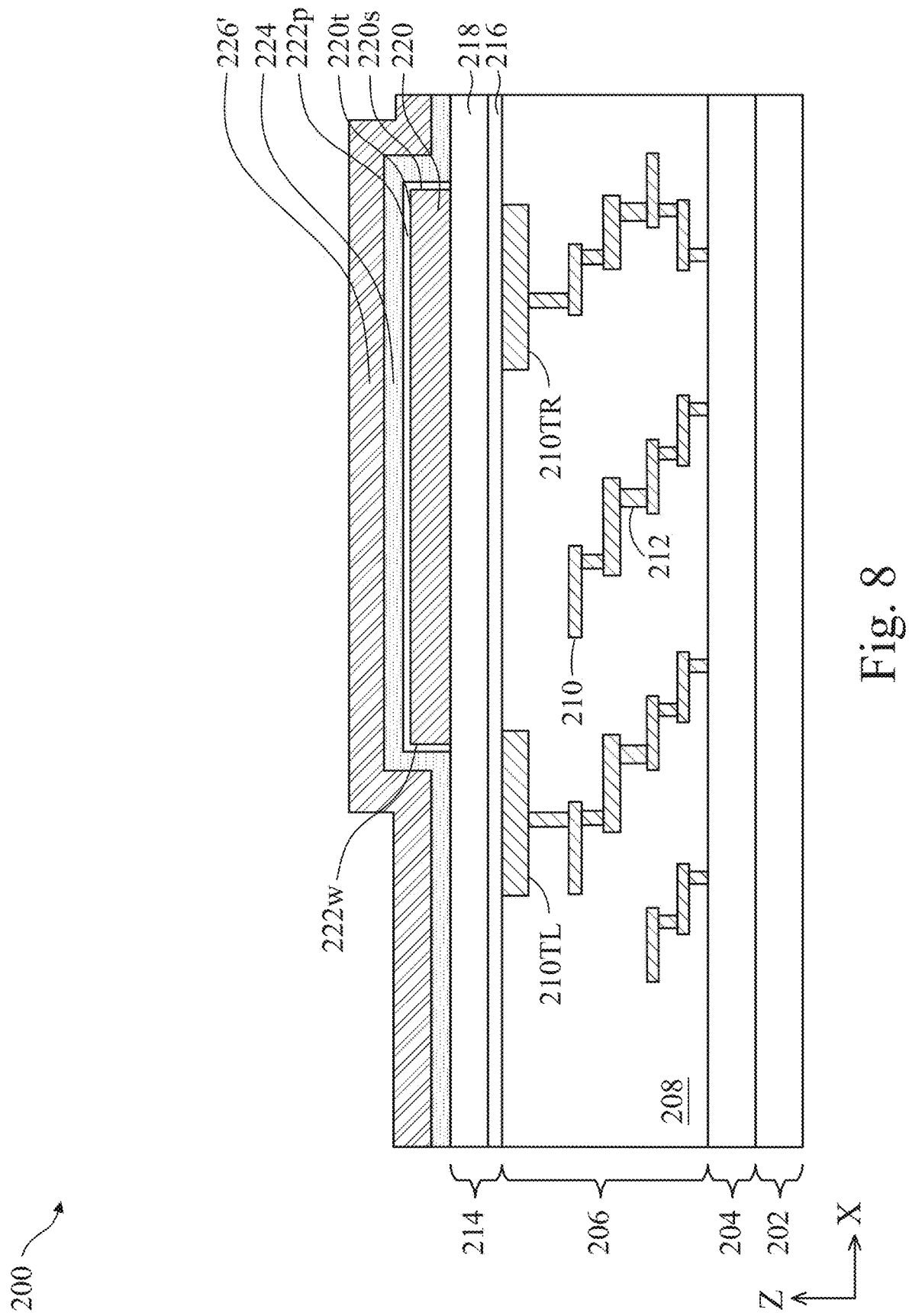

As previously discussed, the straining layer 222 has a lattice structure that improves crystallinity of the high-k dielectric layer 224. Crystallinity, which refers to the degree of structural order a material, has great influences of material characters. It has been observed that increased crystallinity in metal oxides results in increase of the dielectric constant. Increased dielectric constant in the high-k dielectric layer 224 increases the capacitance density of the subsequently formed MIM capacitor. As shown in FIG. 7C, the high-k dielectric layer 224 formed on the straining layer 222 has increased k-value because of the improved crystallinity. It has been observed that the degree of the intragranular strain in the first electrode 220 is proportional to the degree of crystallinity of the high-k dielectric layer 224 as shown in the FIGS. 7D and 7E. In FIG. 7D, the x-axis indicates the degree of in-plain strain in the first electrode 220 and y-axis indicates the degree of crystallinity in the high-k dielectric layer 224 according to one example of embodiments of the present disclosure. FIG. 7D indicates that the degree of the intragranular strain in the first electrode 220 is proportional to the degree of crystallinity of the high-k dielectric layer 224. FIG. 7E demonstrates a correlation between crystallinity and k-value in the high-k dielectric layer 224. In FIG. 7E, the x-axis indicates a thickness of the high-k dielectric layer 224, and y-axis indicates an inverse capacitance density (CET). Materials of three splits are shown. Points in each split refer to CET value of a high-k dielectric layer with the same degree of crystallinity but different thickness. Th The slope of various points in each split corresponds to the k value of the high-k dielectric layer. The dielectric material in Split 1 has the lowest degree of crystallinity, thus has the lowest k value. The dielectric material in Split 3 has the highest degree crystallinity, thus has the highest k value. The dielectric material in Split 2 has a medium degree of crystallinity, thus has the medium k value. Thus, FIG. 7E shows the stronger the crystallinity, the larger the k-value. By using the straining layer 222, embodiments of the present disclosure increase the crystallinity resulting in increased capacitance density in the subsequently formed MIM capacitor.

Figure 9A:
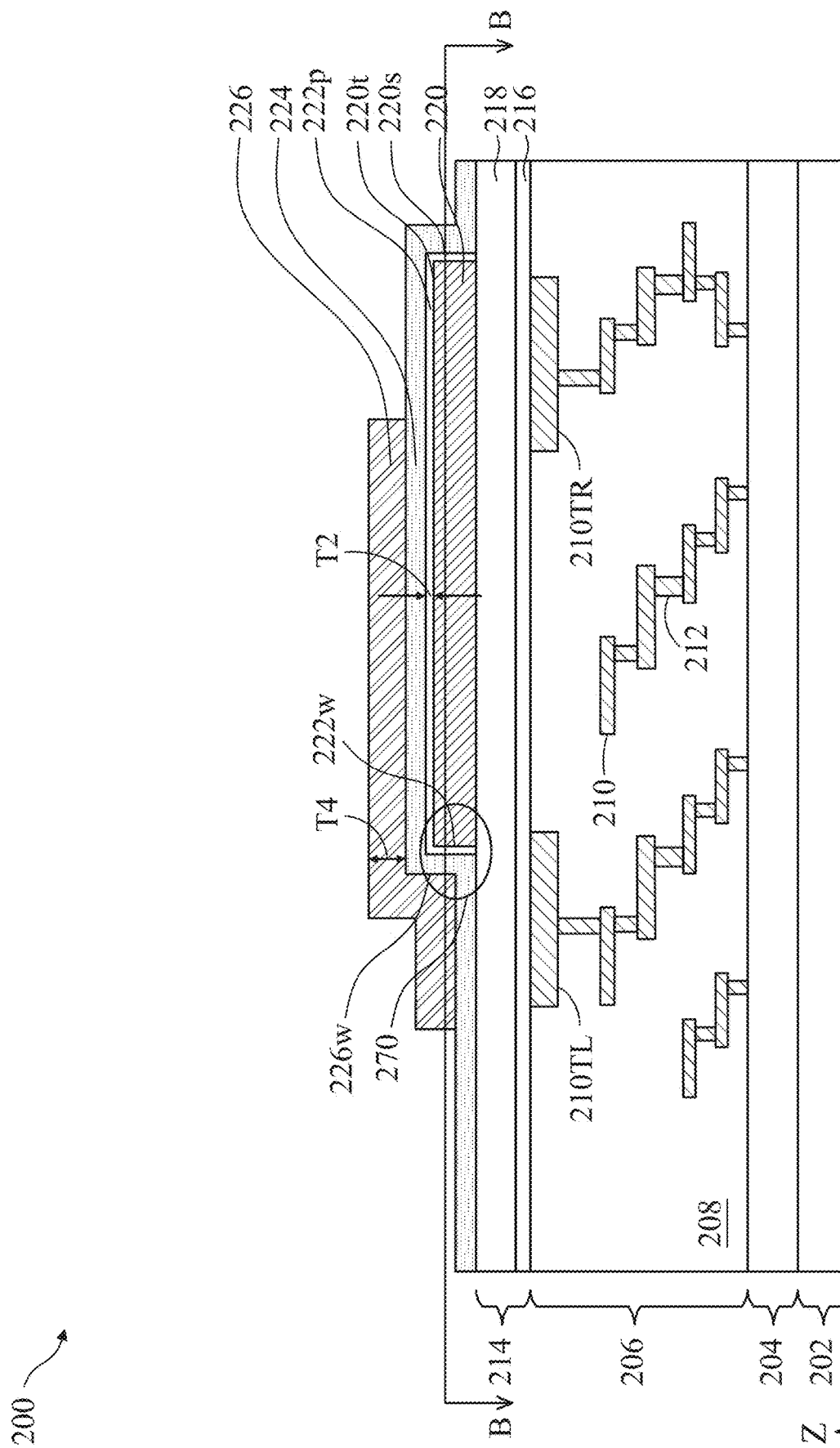
Figure 9B:
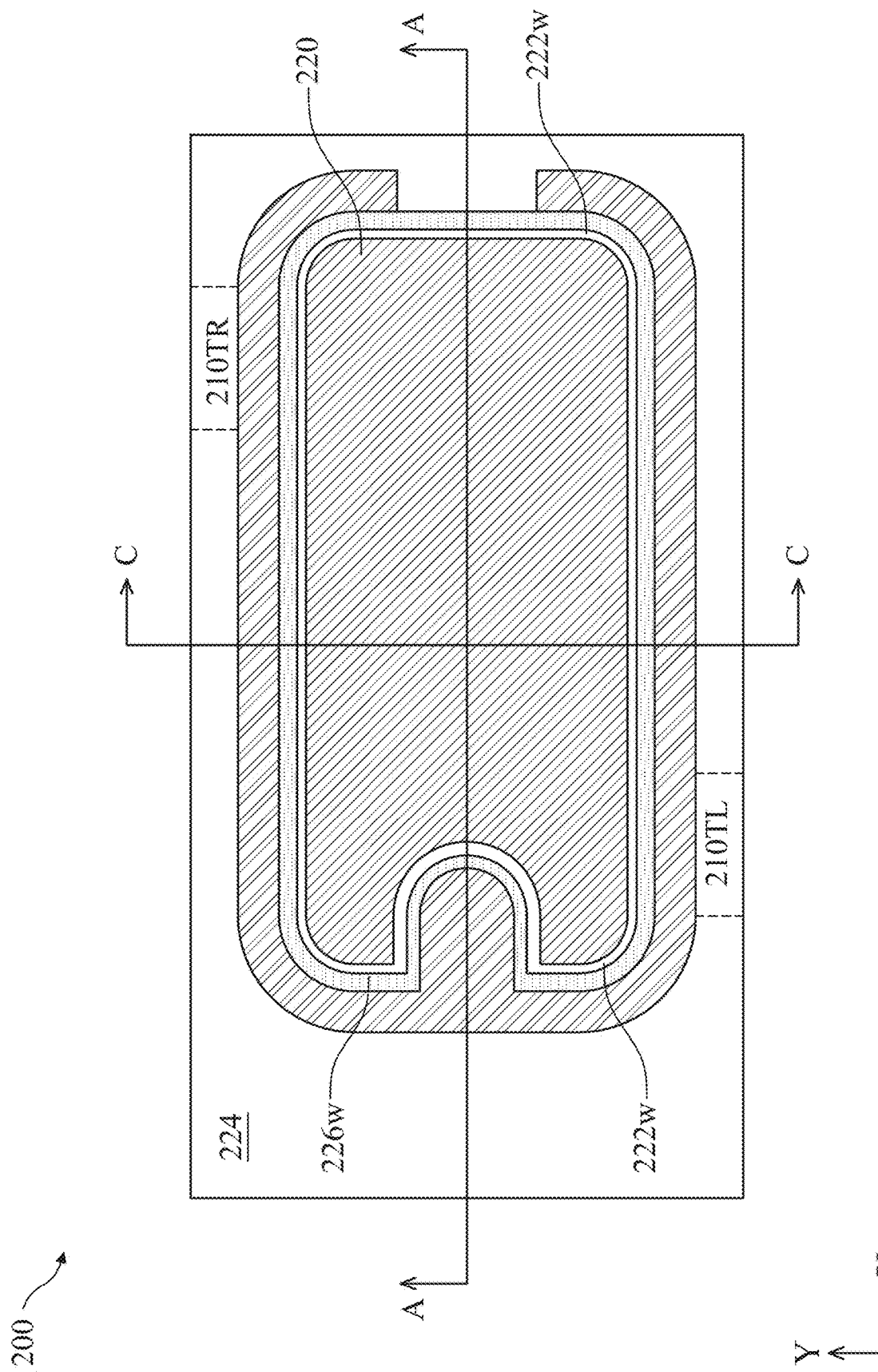
Figure 9C:
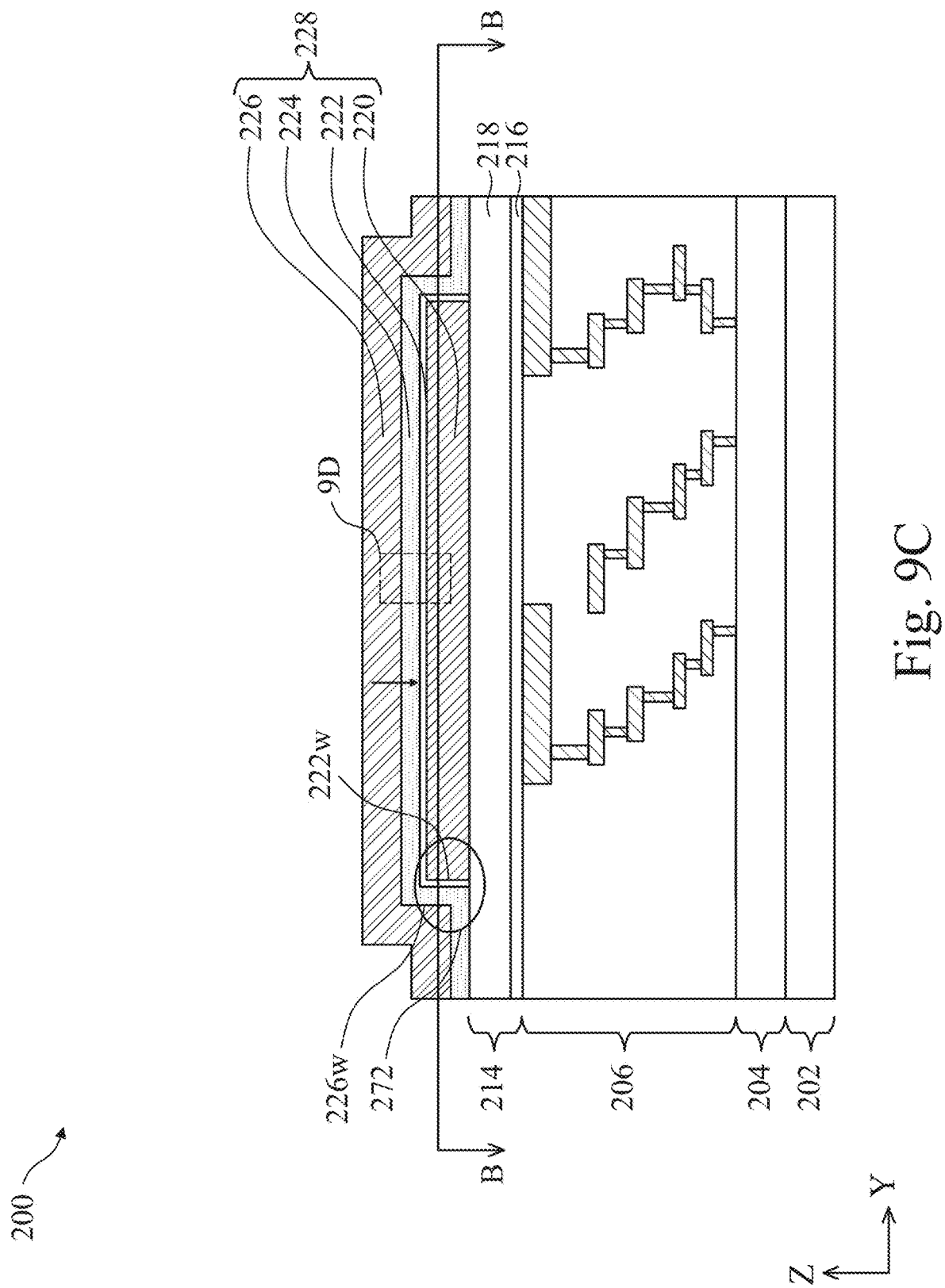

At operation 112, a second electrode 226 is formed by depositing and patterning a conductive layer 226' as shown in FIGS. 8, 9A, 9B, and 9C. The conductive layer 226' may be conformally deposited on the dielectric layer 224, as shown in FIG. 4, and then patterned to form a desired shape corresponding to the capacitor to be formed, as shown in FIGS. 9A and 9B. FIG. 9C is a cross-sectional view of the capacitor device 200 along the C-C line in FIG. 9B.

In some embodiments, like the first electrode 220, the second electrode 226 is formed from a material with a columnar crystalline texture across the thickness or along the z-direction. In some embodiments, the second electrode 226 may include a transitional metal nitride having a columnar crystalline texture, such as a titanium nitride (TIN), tantalum nitride (TaN), molybdenum nitride (MoN), or a combination thereof. In some embodiments, a PVD process is used to form columnar textures. Alternatively, the second electrode 226 may include any suitable conductive material, without columnar textures. The second electrode 226 may include TIN, Si, polysilicon, Ta, Ti, TaN, W, Cu, Al, AlCu, Ir, Ru, Pt, or a combination thereof.

The second electrode 226 may be patterned variety of shapes in the x-y plane, for example a circle, a curvilinear shape, a rectangle, a line, a polygon including with rounded corners, and/or other suitable shapes. In some embodiment, the second electrode 226 covers an area which overlaps the area of the first electrode 220 except including an opening to, expose the conductive features 210TR. In the example of FIG. 9B, the second electrode 226 has a substantially rectangular shape with an opening for a vertical contact to connect to the conductive feature 210TR. The second electrode 226 may has a thickness T3 along the z-direction. In some embodiments, the thickness T4 may be in a range between about 15 nm and about 60 nm.

Figure 9D:
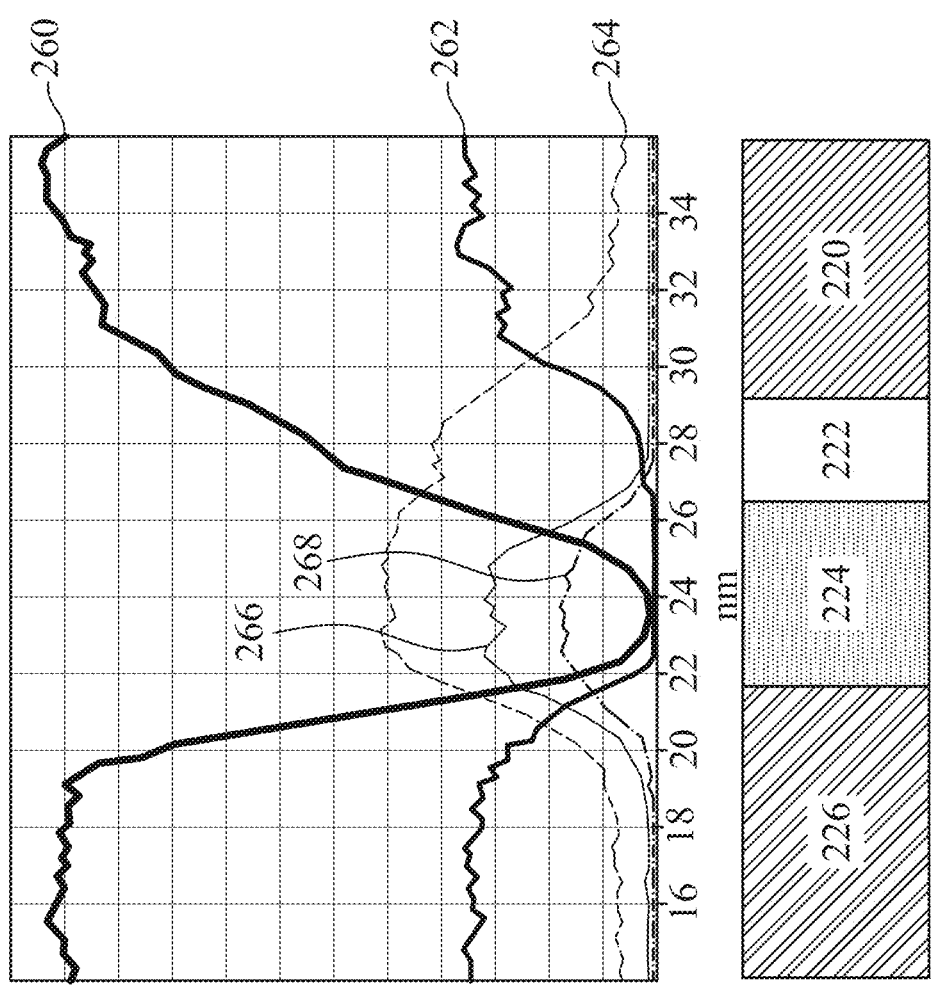
FIG. 9D is a schematic plot showing composition across a MIM capacitor according to the present disclosure.

At this stage, the first electrode 220, the straining layer 222, the high-k dielectric layer 224, and the second electrode 226 have formed a MIM capacitor 228. FIG. 9D includes concentration of elements across layers of the MIM capacitor 228 within an area marked by 9D in FIG. 9C, according to one example. In the example, the first electrode 220 and the second electrode include a nitride of a first metal. The straining layer includes an oxynitride of the first metal. The high-k dielectric layer 224 includes oxides of a second metal and a third metal. In FIG. 9D, the x-axis indicates a distance cross thickness of the layers, and the y-axis indicates atomic concentration of various elements. Curve 260 represents the atomic concentration of the first metal. Curve 262 represents the atomic concentration of nitrogen. Curve 264 represents the atomic concentration of the oxygen. Curve 266 represents the atomic concentration of the second metal. Curve 268 represents the atomic concentration of the third metal.

In some embodiments, the wall portion 222$w$ of the straining layer 222 may function as a spacer between the first electrode 220 and the second electrode 226 at corner regions, such as regions 270, 272 marked in FIGS. 9A and 9C. As shown in regions 270, 272, because the high-k dielectric layer 224 is significantly thinner than the first electrode 220, a step shape may remain around the sidewall 220s of the first electrode 220 after deposition of the high-k dielectric layer 224. The second electrode 226 formed over the first high-k dielectric layer 224 may have a drop wall portion 226w. If the high-k dielectric layer 224 has a weak coverage on the sidewall 220s, leakage may occur between the drop wall portion 226w of the second electrode 226 and the sidewall 220s of the first electrode 220. Because the straining layer 222 is formed on and between grain boundaries of the first electrode 220, the wall portion 222w of the straining layer 222 inherently has good step coverage to the sidewall 220s of the first electrode 220. In situations when the high-k dielectric layer 224 has a weak step coverage, the wall portion 222w of the straining layer 222 provide additional insulation between the first electrode 220 and the second electrode 226 preventing breakdown in the MIM capacitor 228. FIG. 9B is a cross sectional view along line B-B, which is across the sidewall 220s of the first electrode 220. As shown in FIG. 9B, the wall portion 222w surrounds the entire sidewall 220s of the first electrode 220 and sandwiched between the drop wall portion 226w of the second electrode 226 and the sidewall 220s of the first electrode 220.

After formation of the second electrode 226, operations 150 and 160 may be performed to seal and connect the MIM capacitor 228. In some embodiments, operations 108, 110, 112 may be repeated to form additional MIM capacitors stacked over the MIM capacitor 228, as shown in FIGS. 10-15.

Figure 10:
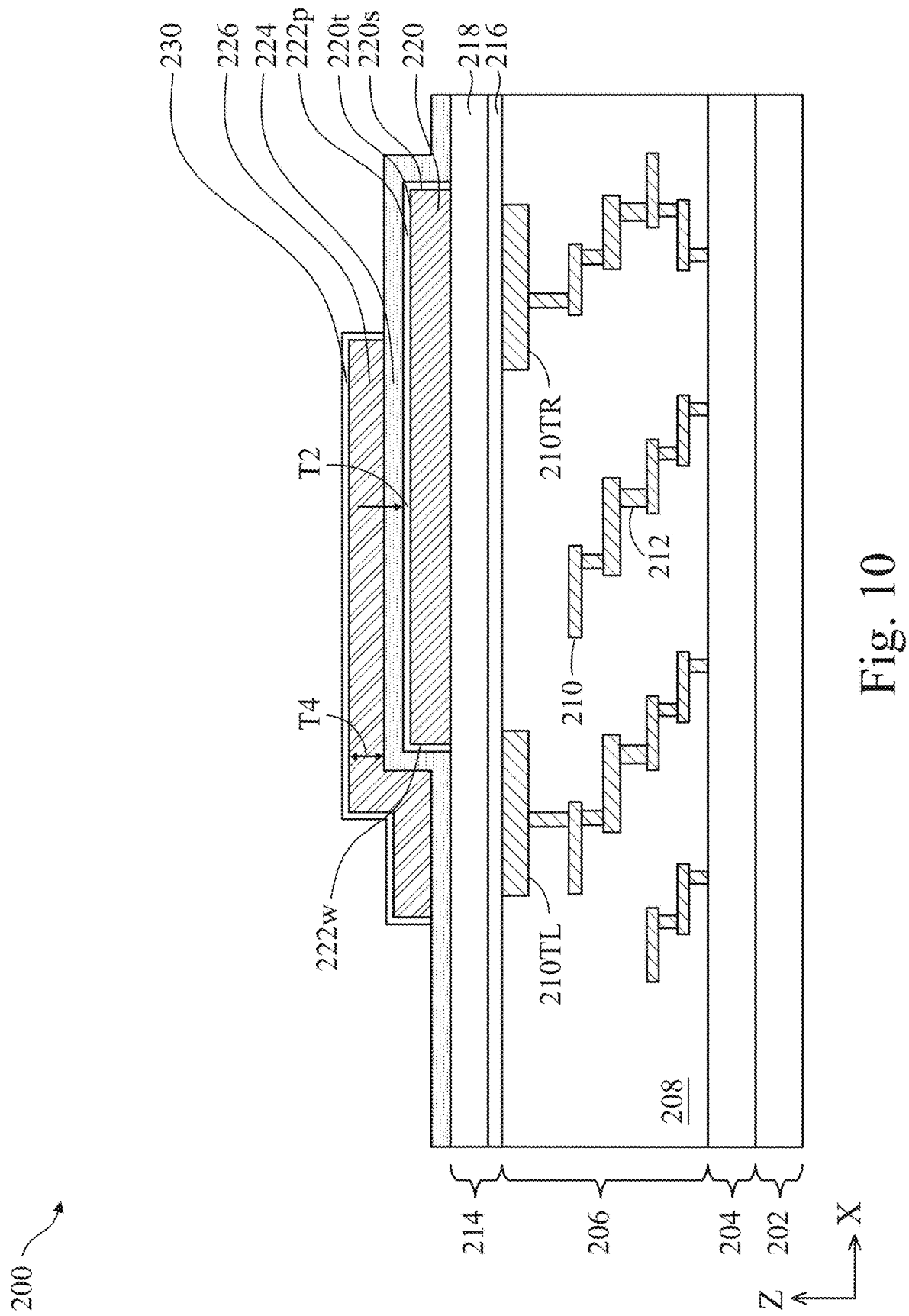
Figure 11:
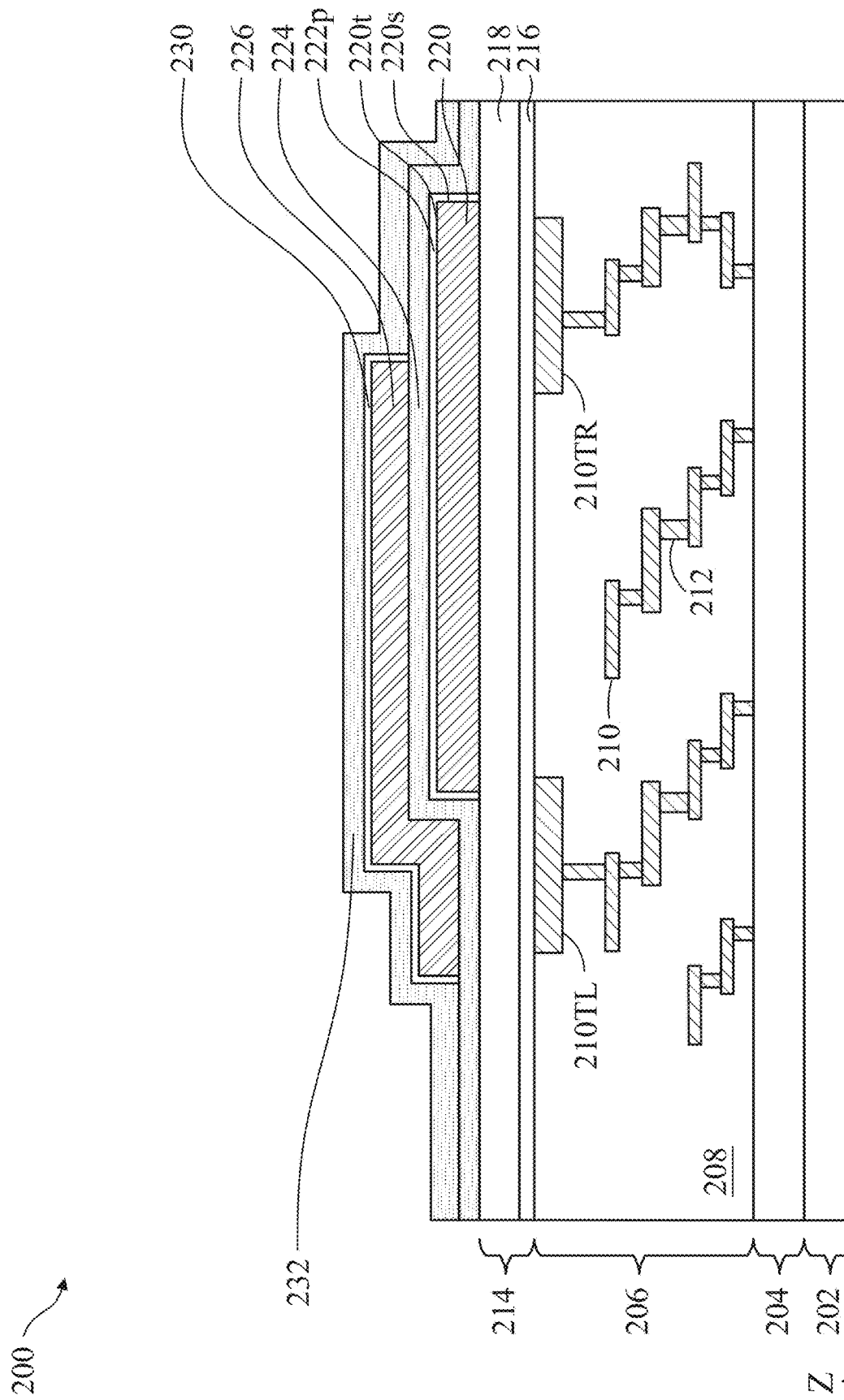
Figure 12:
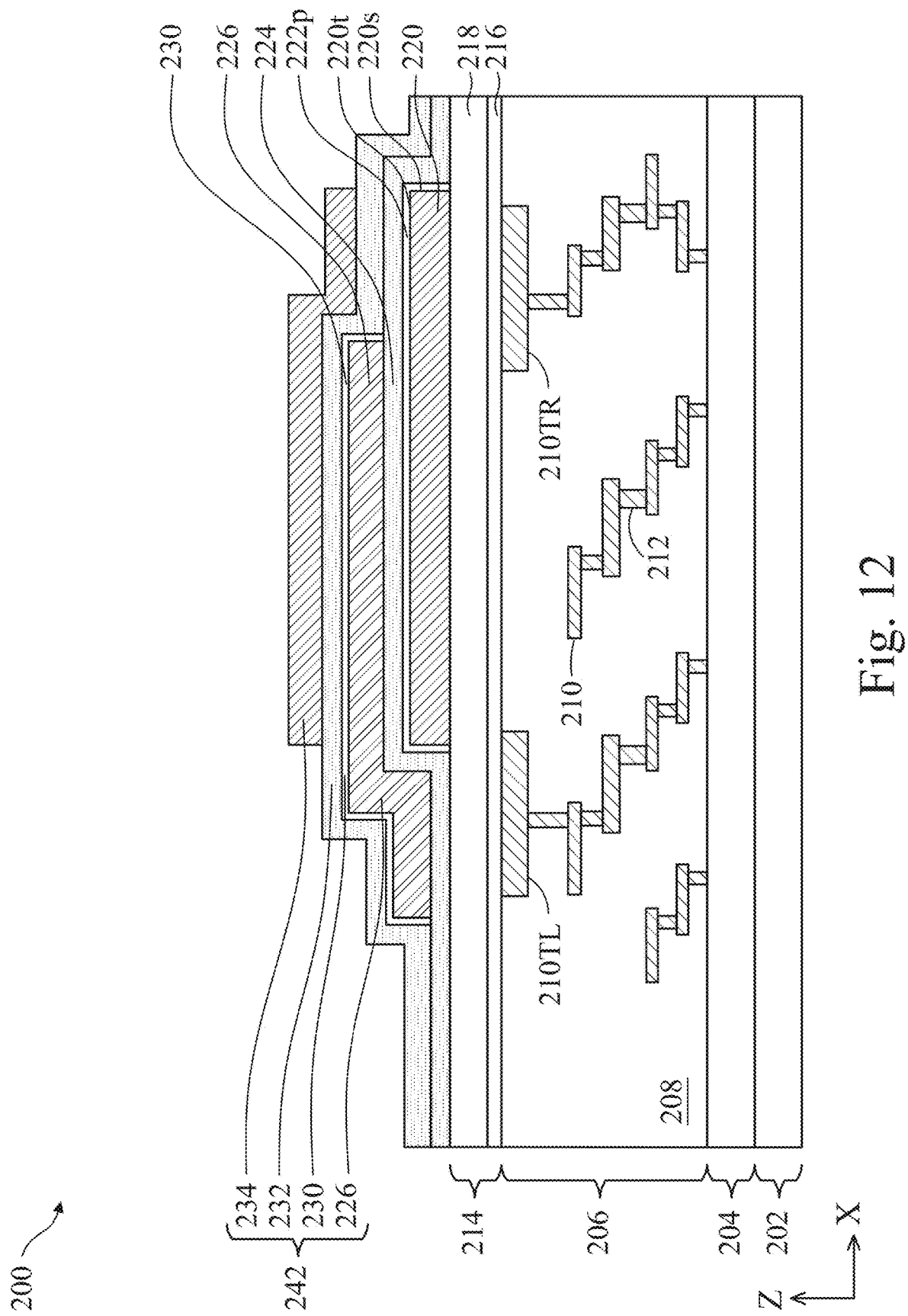

In FIG. 10, a straining layer 230 is on exposed surfaces of the second electrode 226 by performing operation 108. The straining layer 230 is similar to the straining layer 222. In FIG. 11, a high-k dielectric layer 232 is deposited over the straining layer 230 by performing operation 110. The high-k dielectric layer 232 is similar to the high-k dielectric layer 224. In FIG. 12, a third electrode 234 is formed on the high-k dielectric layer 232 by performing operation 112. The third electrode 234 may be similar to the first electrode 220 and the second electrode 226. In some embodiments, the third electrode 234 may have a contact opening align with the contact opening in the first electrode 220. At this stage, the second electrode 226, the straining layer 230, the high-k dielectric layer 232, and the third electrode 234 have formed a MIM capacitor 242. After formation of the third electrode 234, operations 150 and 160 may be performed to seal and connect the MIM capacitors 228, 242.

Figure 13:
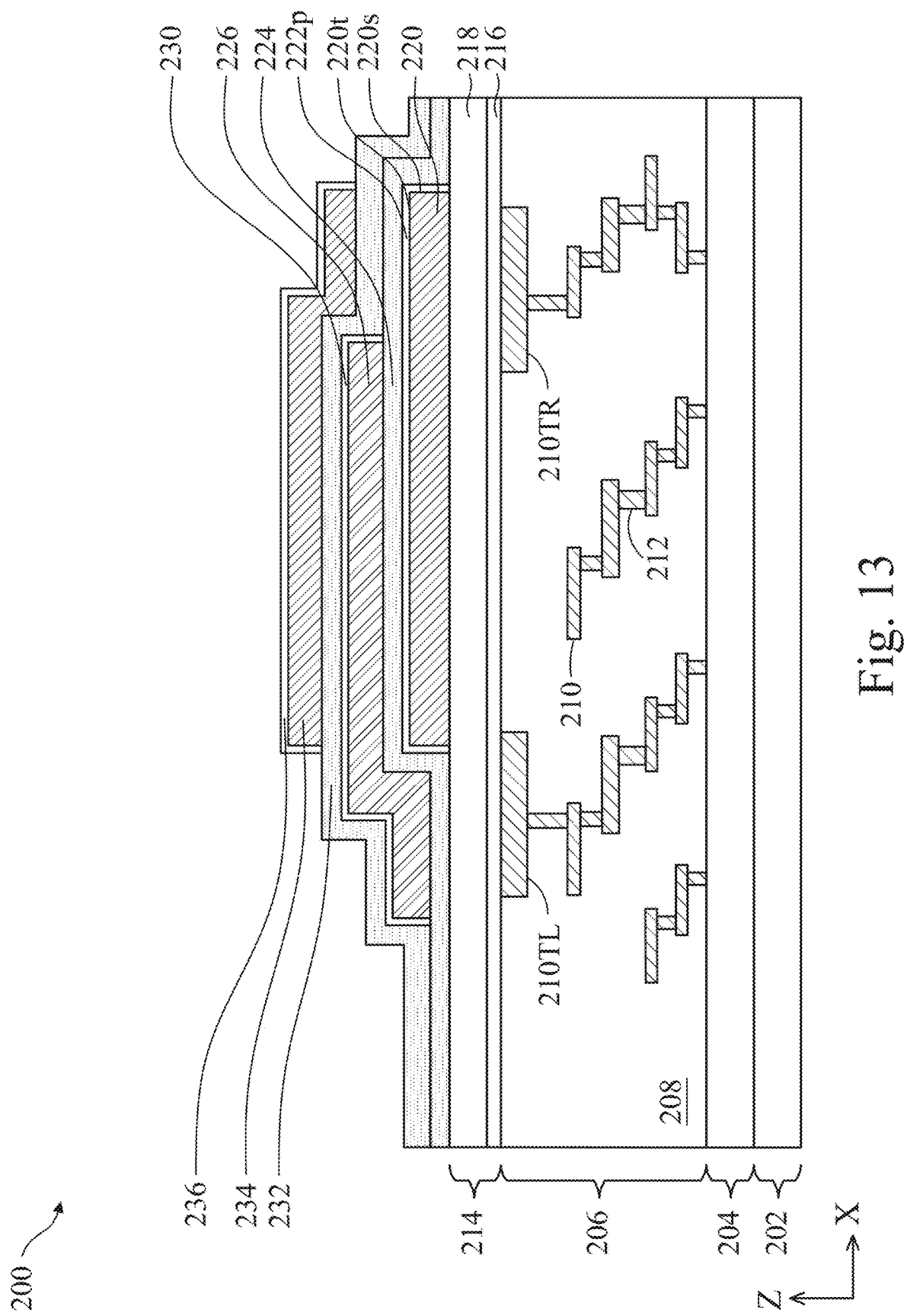
Figure 14:
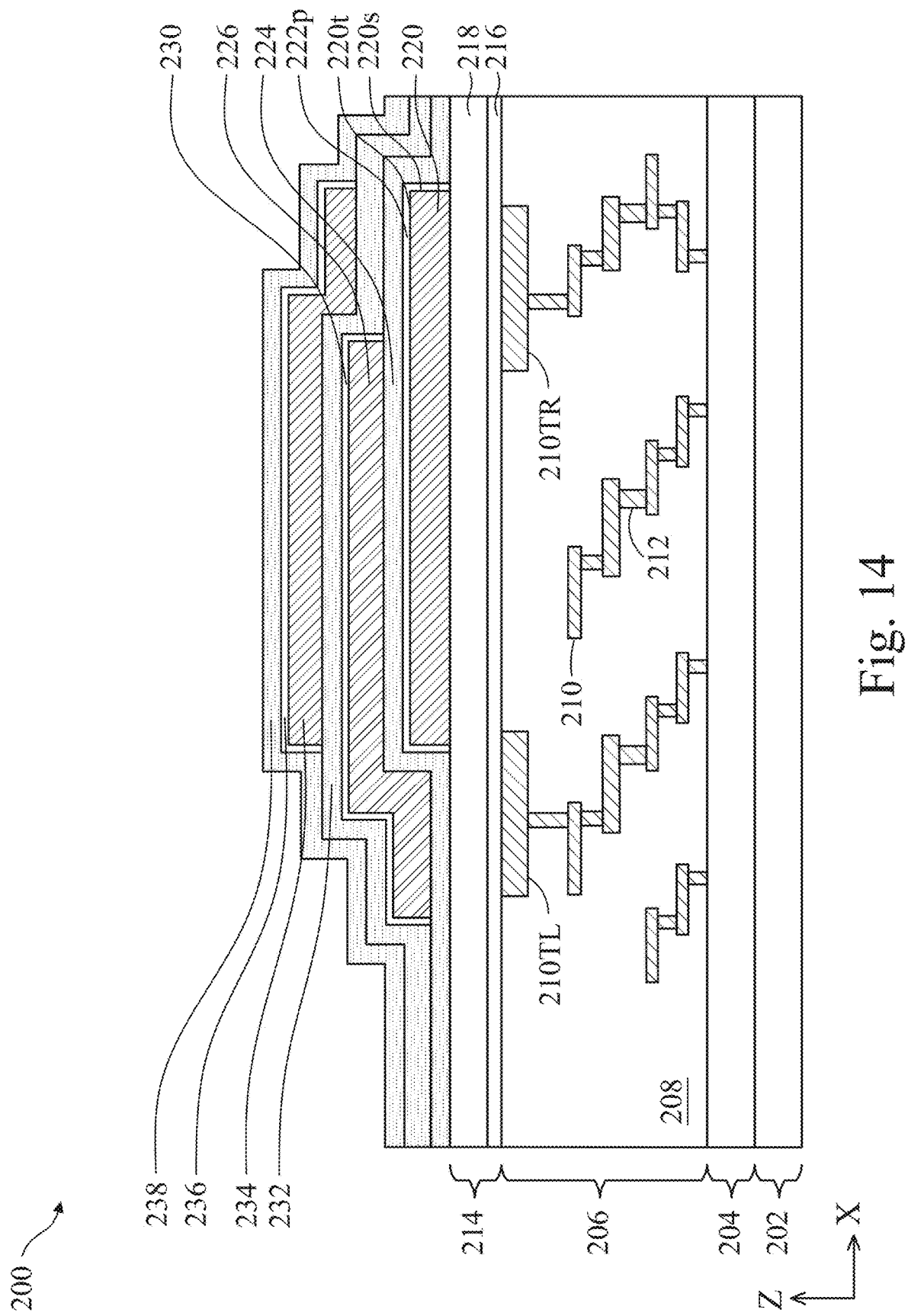
Figure 15:
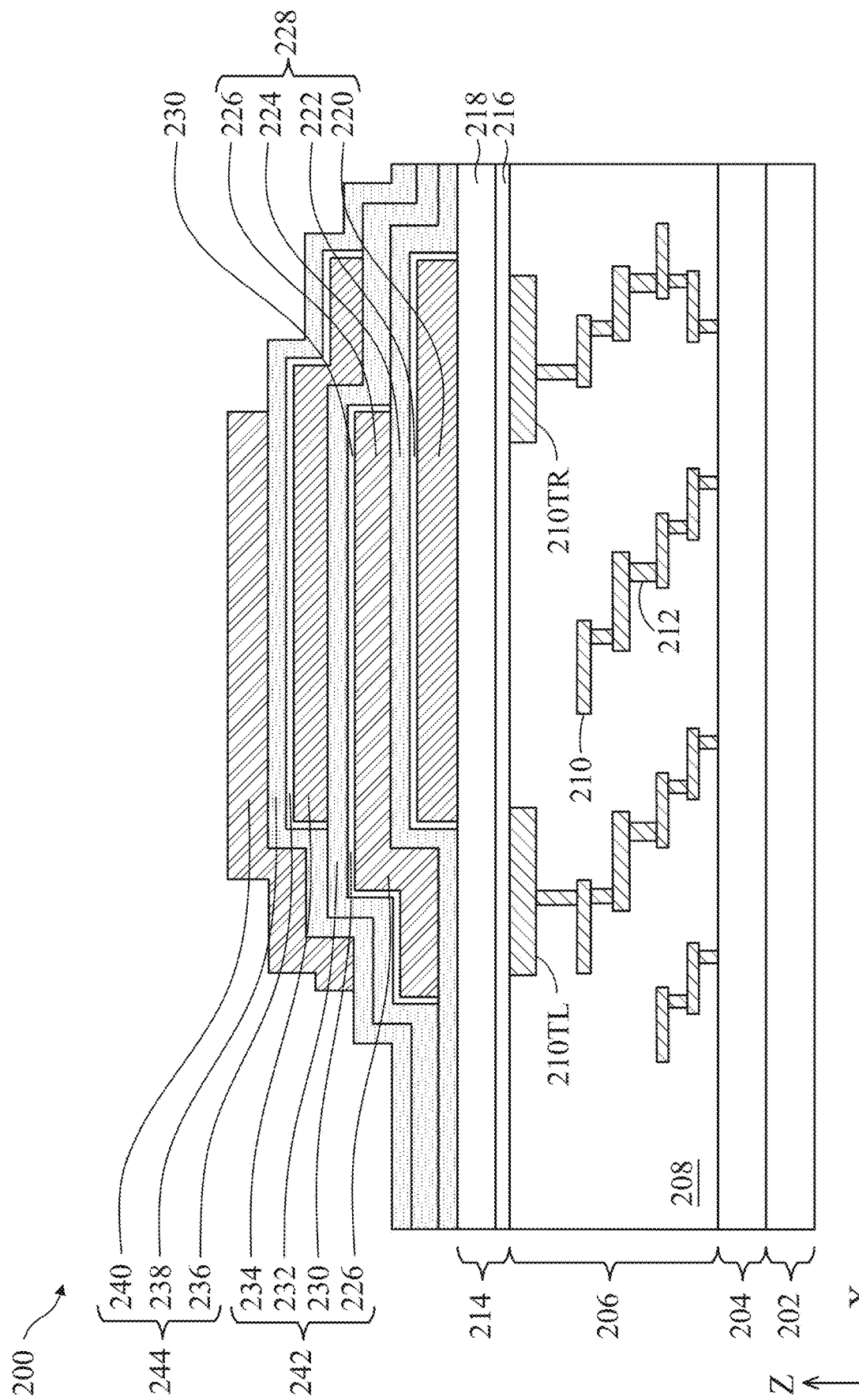

In FIG. 13, a straining layer 236 is on exposed surfaces of the third electrode 234 by performing operation 108. The straining layer 236 is similar to the straining layers 222, 230. In FIG. 14, a high-k dielectric layer 238 is deposited over the straining layer 236 by performing operation 110. The high-k dielectric layer 238 is similar to the high-k dielectric layers 224, 232. In FIG. 15, a fourth electrode 240 is formed on the high-k dielectric layer 238 by performing operation 112. The fourth electrode 240 may be similar to the first electrode 220, the second electrode 226, and the third electrode 234. In some embodiments, the fourth electrode 240 may have a contact opening align with the contact opening in the third electrode 234. At this stage, the third electrode 234, the straining layer 236, the high-k dielectric layer 238, and the fourth electrode 240 have formed a MIM capacitor 244. Operations 108, 110, and 112 may be further repeated to form additional capacitors over the MIM capacitors 228, 242, 244.

Figure 16:
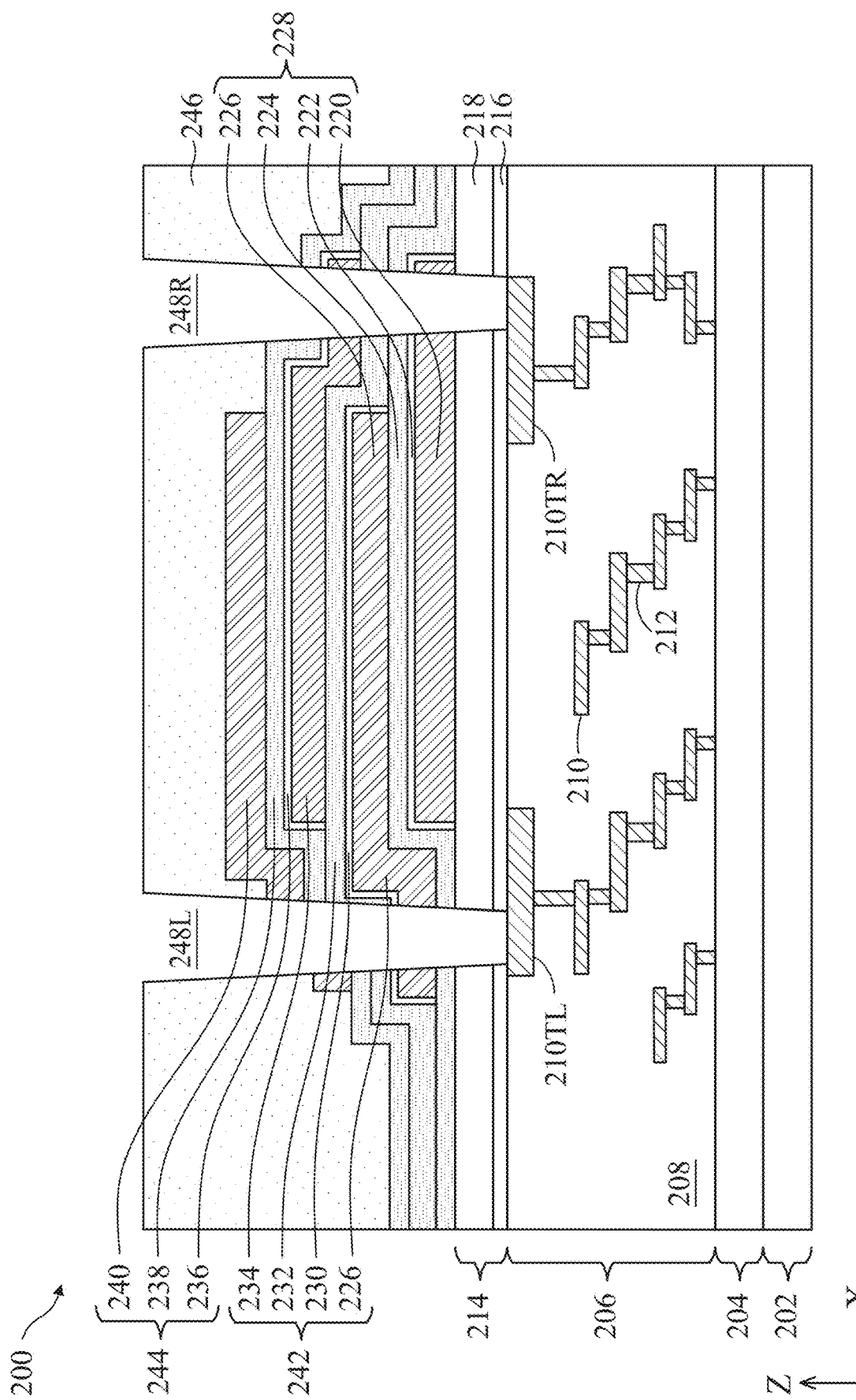

At operation 150, a dielectric layer %246% is formed to cover exposed portions of the MIM capacitors 228, 242, 244, as shown in FIG. 16. In some embodiments, the dielectric layer %246% is similar to or the same as the dielectric constant of the dielectric layer %218. For example, the dielectric constant of the dielectric layer %246% may be lower than the dielectric constants of the high-k dielectric layers %224, 232, 238. In some embodiments, the dielectric layer 246 may include undoped silicate glass (USG), fluorinated silicate glass (FSG), carbon-doped silicate glass, silicon oxide, silicon nitride or silicon oxynitride. In some embodiments, the dielectric layer 218 may be formed by a chemical vapor deposition (CVD) process, a spin-on process, a sputtering process, or a combination thereof. In some embodiments, the thickness of the dielectric layer 246 is in a range from about 3000 Å to about 5000 Å.

At operation 160, contact features 250L, 250R are formed to connect MIM capacitors 228, 242, 244, as shown in FIGS. 16 and 17A-17C. As shown in FIG. 16, contact openings 248L, 248R are formed through the dielectric layer 246 and various layers of the capacitors 228, 242, 244, the dielectric layer 218, the etch stop layer 216, and expose the topmost conductive features 210TL, 218TR respectively. The contact openings 248L, 248R may be formed by patterning and suitable etching processes, such as plasma-induced etching process. The contact opening 248L penetrates the second electrode 226 and the fourth electrode 240 but avoids the first electrode 220 and the third electrode 234 by aligning with the openings in the first electrode 220 and the third electrode 234. Similarly, the contact opening 248R penetrates the first electrode 220 and the third electrode 234 but avoids the second electrode 226 and the fourth electrode 240 by aligning with the openings in the second electrode 226 and the fourth electrode 240.

The contact openings 248L, 248R are then filled with a conductive material to form contact features 250L, 250R respectively. The contact features 250L, 250R may include copper, aluminum, AlCu, and/or other suitable materials. In some embodiments, a barrier layer, not shown, may be deposited in the contact openings 248L, 248R prior to forming the contact features 250L, 250R. The contact feature 250L provides electrical connections among the conductive feature 210TL to the second electrode 226 and the fourth electrode 240, while the conductive features 250R provides electrical connections among the conductive feature 210TR and the first electrode 220 and the third electrode 234.

Figure 17A:
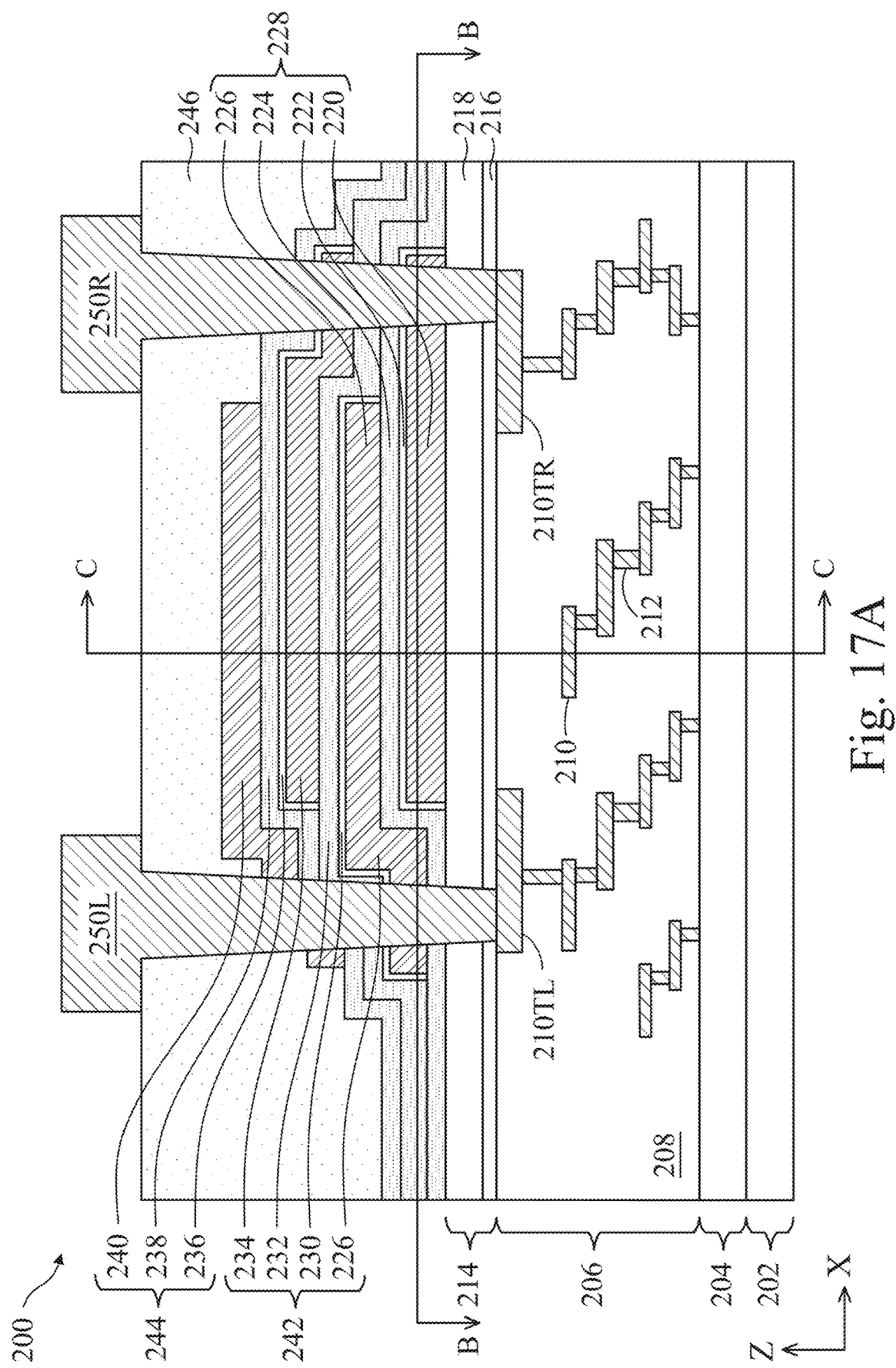
Figure 17B:
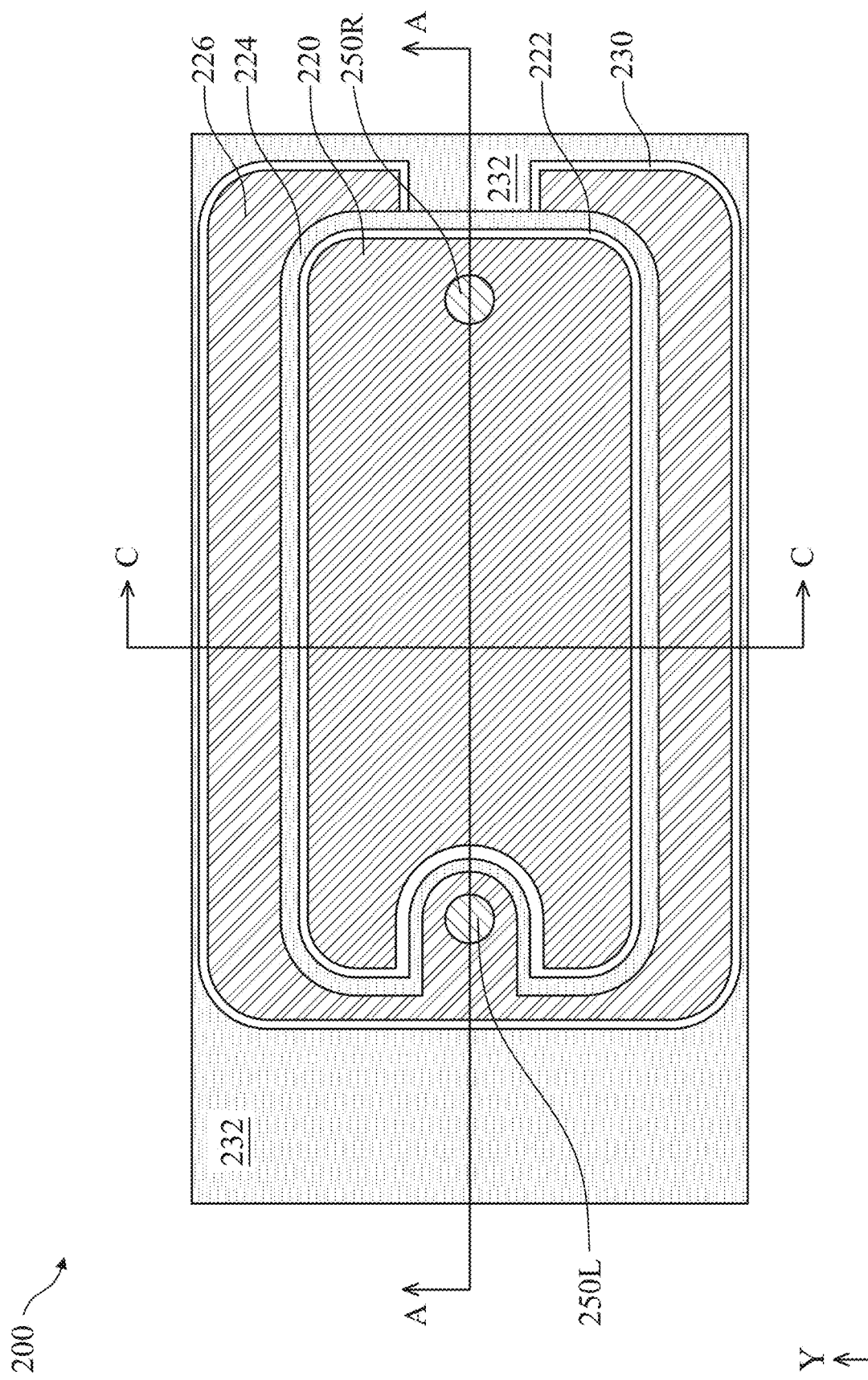
Figure 17C:
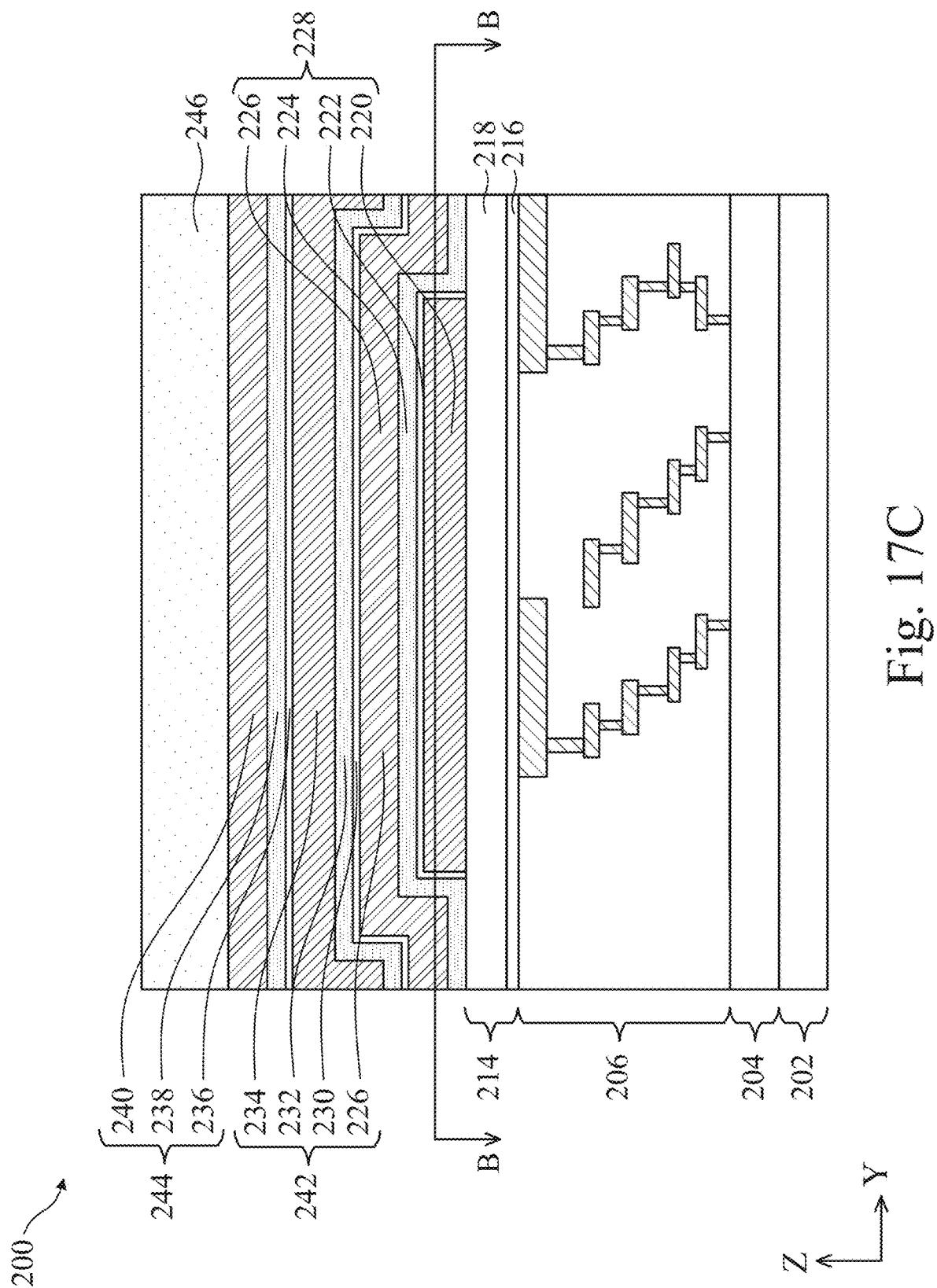
Figure 17D:
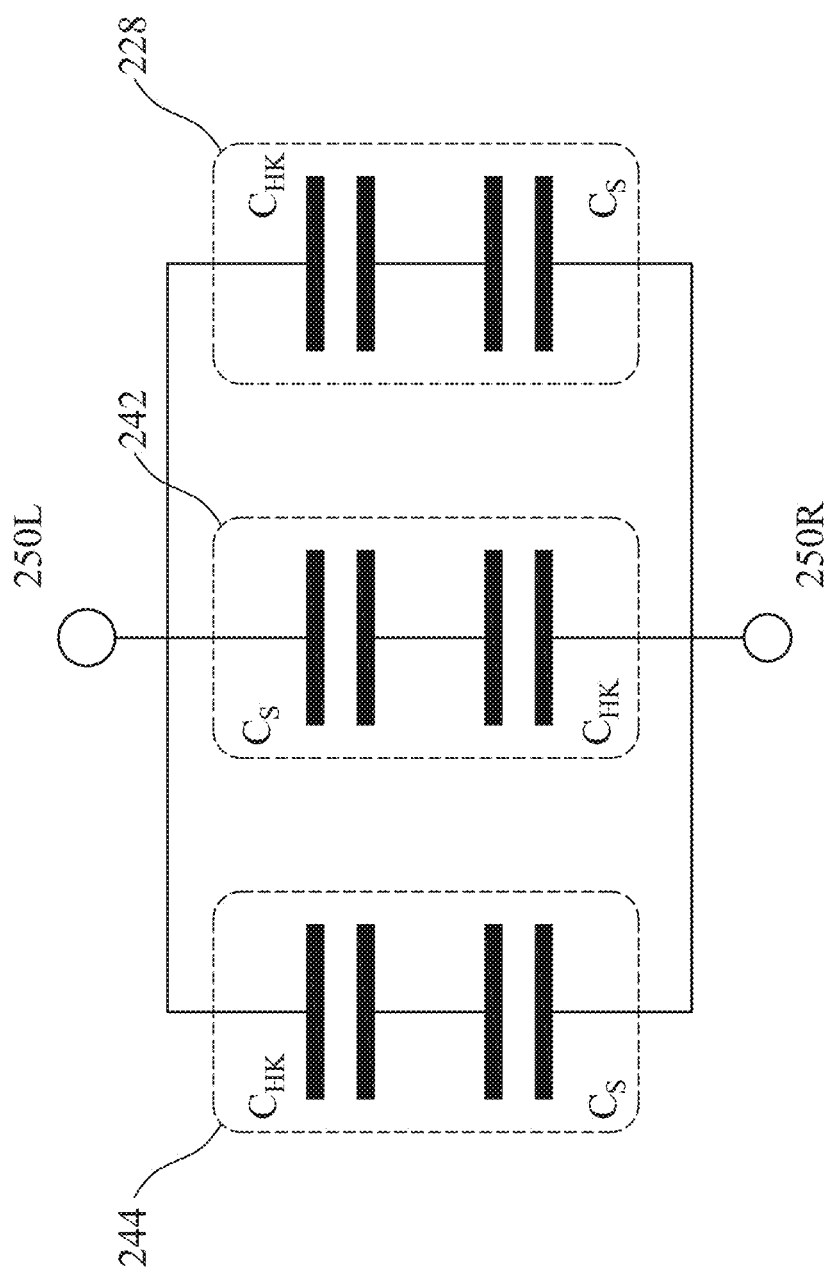
FIG. 17D is an equivalent circuit of the MIM capacitor device according to the present disclosure.

FIG. 17D is an equivalent circuit of the MIM capacitors 228, 242, 244 after formation of the contact features 250L, 250R. The MIM capacitors 228, 242, 244 are parallelly connected between the contact features 250L, 250R. Each MIM capacitor. 228, 242, 244 includes two serially connected capacitors $C_s$ and $C_{HK}$. The capacitor $C_s$ is contributed by the straining layers 222, 230, 236 and the capacitor $C_{HK}$ is contributed by the high-k dielectric layers 224, 232, 238.

Figure 18:
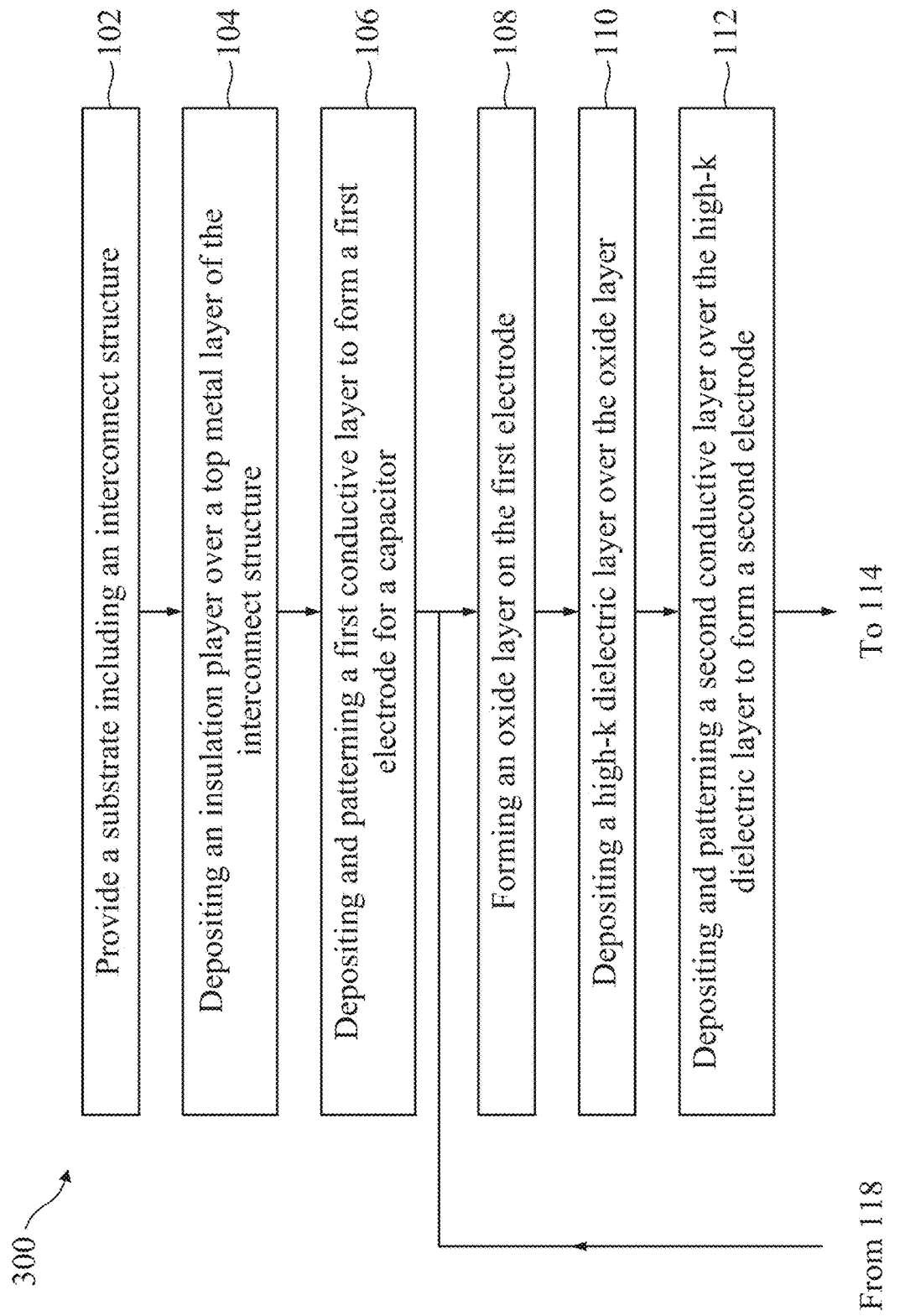
FIG. 18 is a flow chart of a method for fabricating a metal-insulator-metal (MIM) capacitor device according to embodiments of the present disclosure.
Figure 18:
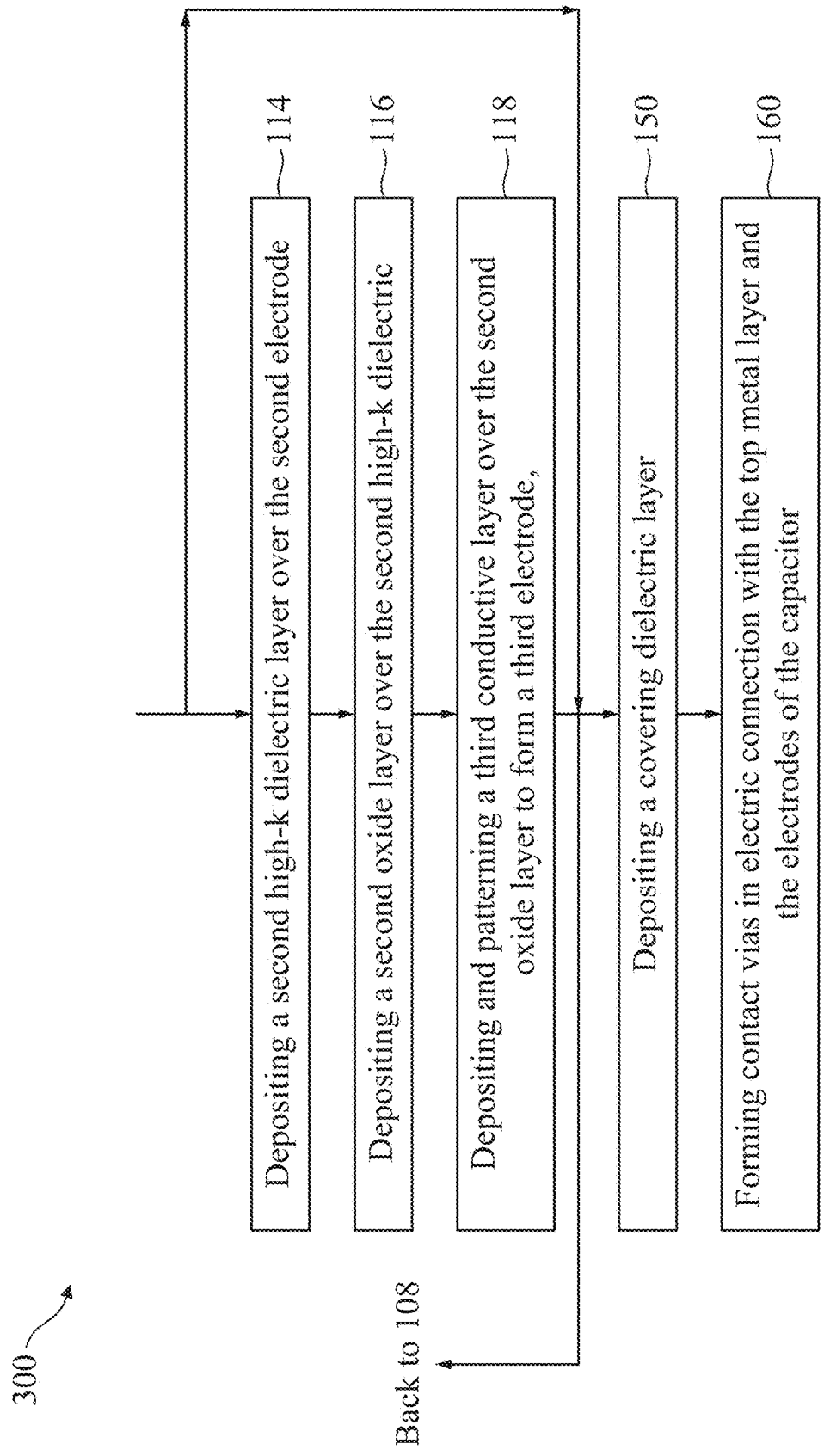

FIG. 18 is a flow chart of a method 300 for fabricating a metal-insulator-metal (MIM) capacitor device according to embodiments of the present disclosure. FIGS. 19-26 and 27A-C schematically illustrate a capacitor device 200a at various stages of fabrication according to the method 300 of FIG. 18. The capacitor device 200a is similar to the capacitor device 200 except that the capacitor device 200a includes MIM capacitors that are symmetrically connected. The method 300 is similar to the method 100 from operations 102 to 112. After operations 102 to 112 of methods, the capacitor device 200a is shown in FIGS. 9A-9C.

Figure 19:
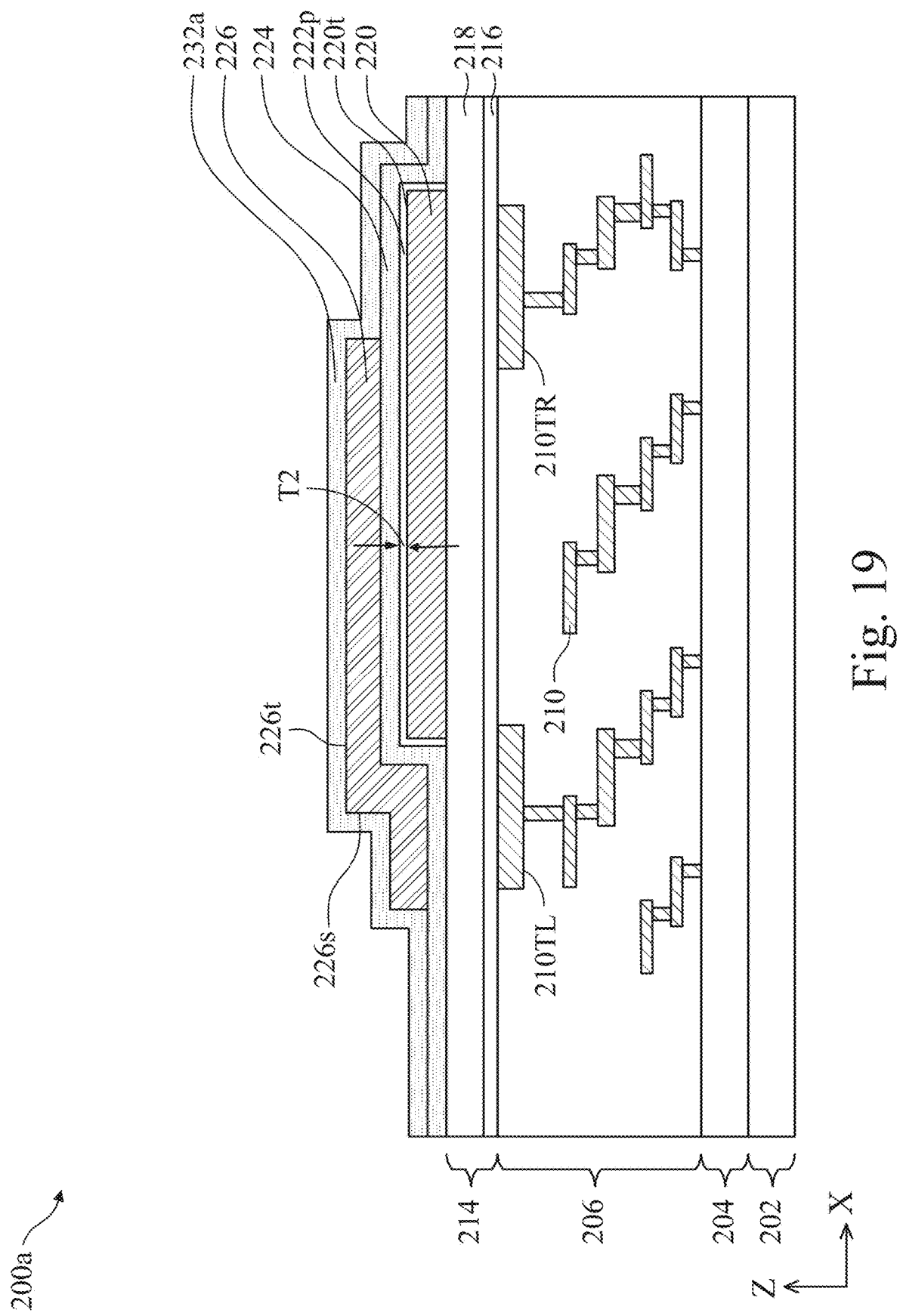
FIGS. 19-26 and 27A-C schematically illustrate a capacitor device at various stages of fabrication according to the method of FIG. 18.

At operation 114 of the method 300, a high-k dielectric layer 232a is formed directly on the second electrode 226 as shown in FIG. 19. The high-k dielectric layer 232a is directly formed on a top surface 226t and sidewalls 226s of the second electrode 226. The high-k dielectric layer 232a may be similar to the high-k dielectric layer 232 of the capacitor device 200.

Figure 20:
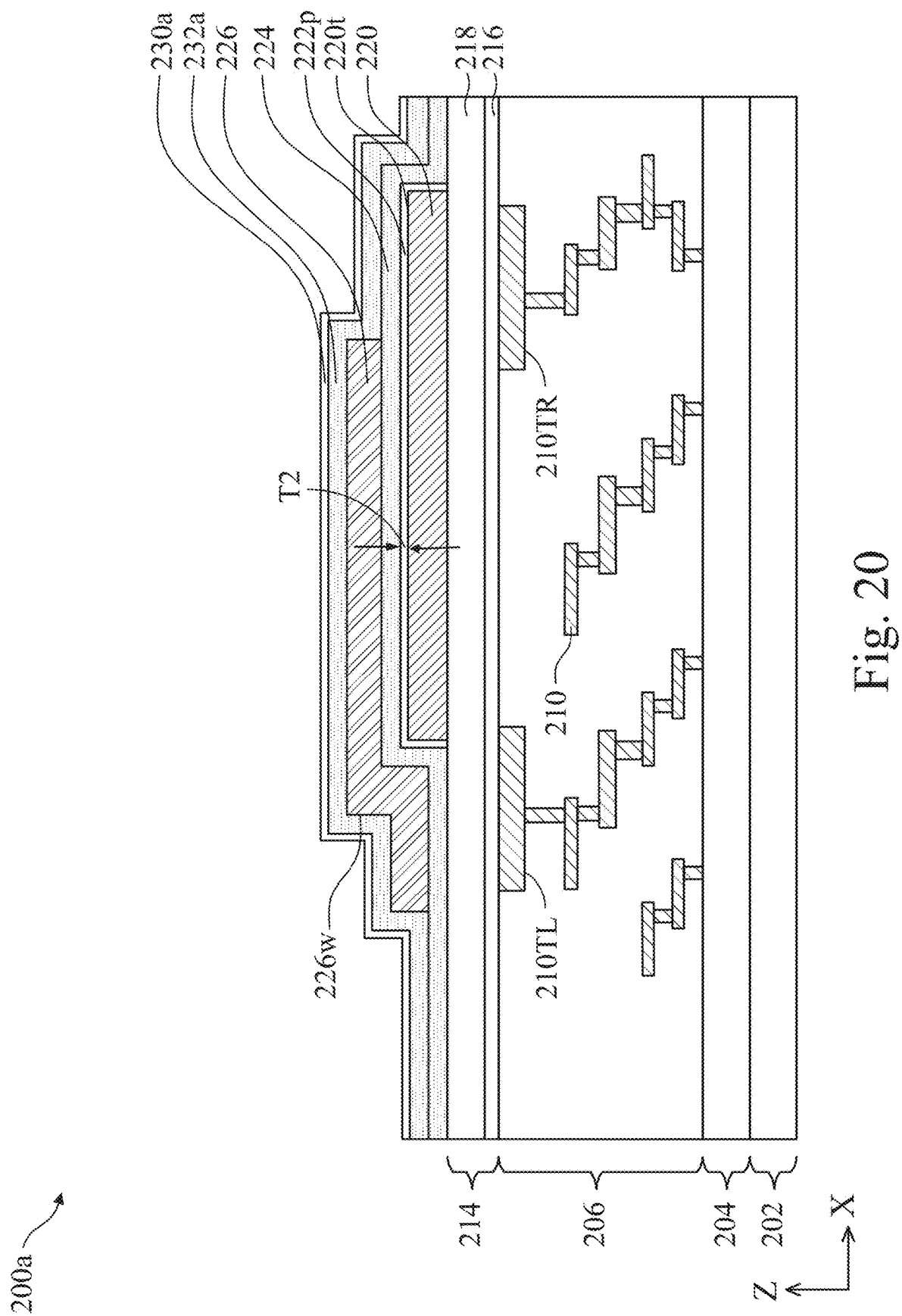

At operation 116, a dielectric layer 230a is formed on the high-k dielectric layer 232a, as shown in FIG. 20. The dielectric layer 230a may have a similar composition and thickness as the straining layer 222 so that the dielectric layer 230a and the straining layer 222 have similar capacitive contribution to the corresponding MIM capacitor. The dielectric layer 230a may comprise a metal oxynitride of a transition metal, such as TiON, TaON, MoON, and a combination. In some embodiments, the dielectric layer 230a has a thickness in a range between 2 nm to 5 nm. The dielectric layer 230a formed conformally on the high-k dielectric layer 232a. In some embodiment, the dielectric layer 230a may be formed by PVD, ALD, MOCVD, and/or other suitable processes. In some embodiments, the dielectric layer 230a may be formed by depositing transitional metal nitride layer followed by an oxidation process.

Figure 21:
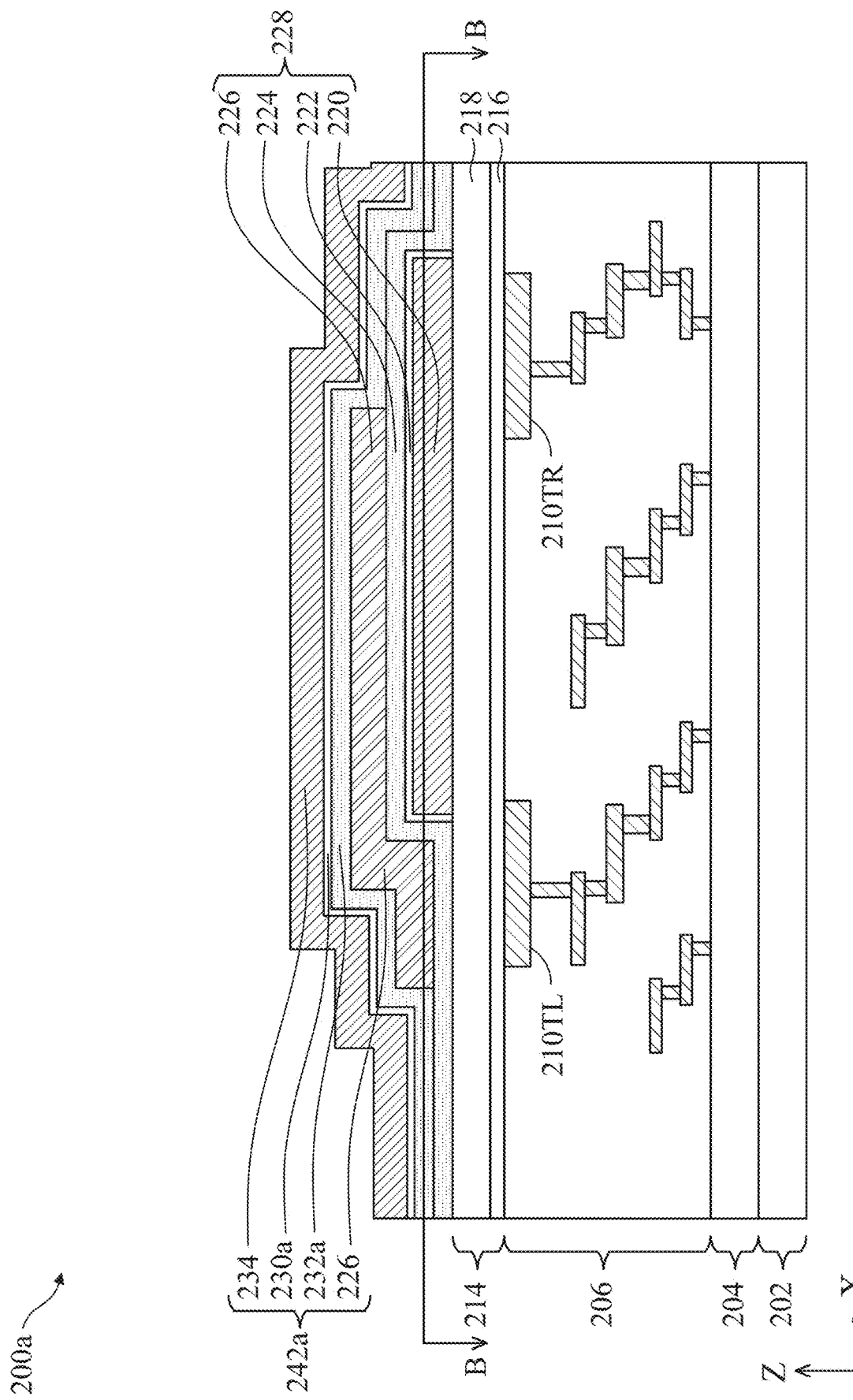
Figure 22:
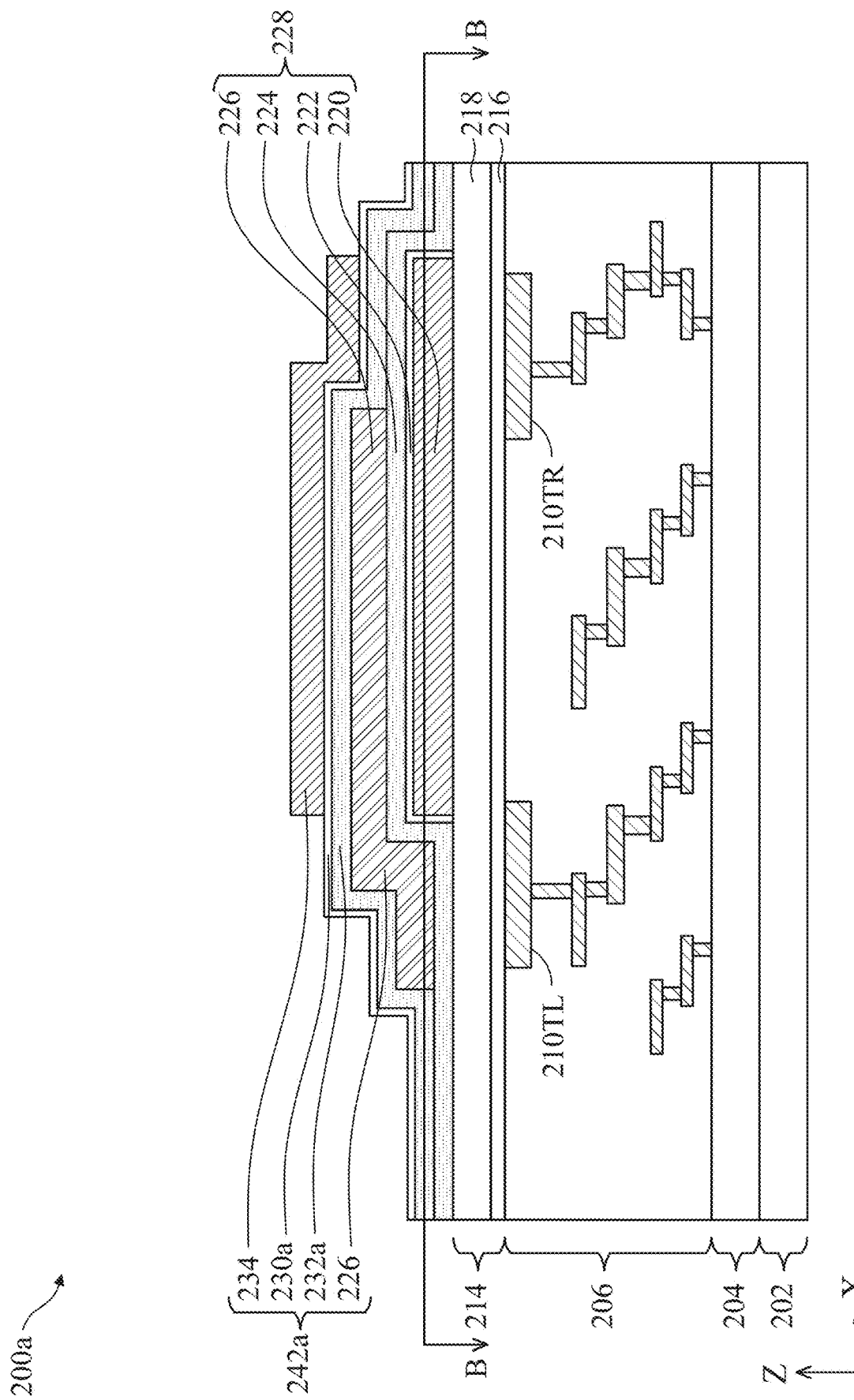

At operation 118, the third electrode 234 is formed over the dielectric layer 230a, as shown in FIGS. 21 and 22. The third electrode 234 may be similar to the first electrode 220 and the second electrode 226. At this stage, the second electrode 226, the high-k dielectric layer 232a, the dielectric layer 230a, and the third electrode 234 have formed a MIM capacitor 242a. As with the straining layer 230, the dielectric layer 230a may also function as a spacer around corner regions of the second electrode 226 to prevent breakthrough in the MIM capacitor 242a between the second electrode 226 and third electrode 234.

Figure 23:
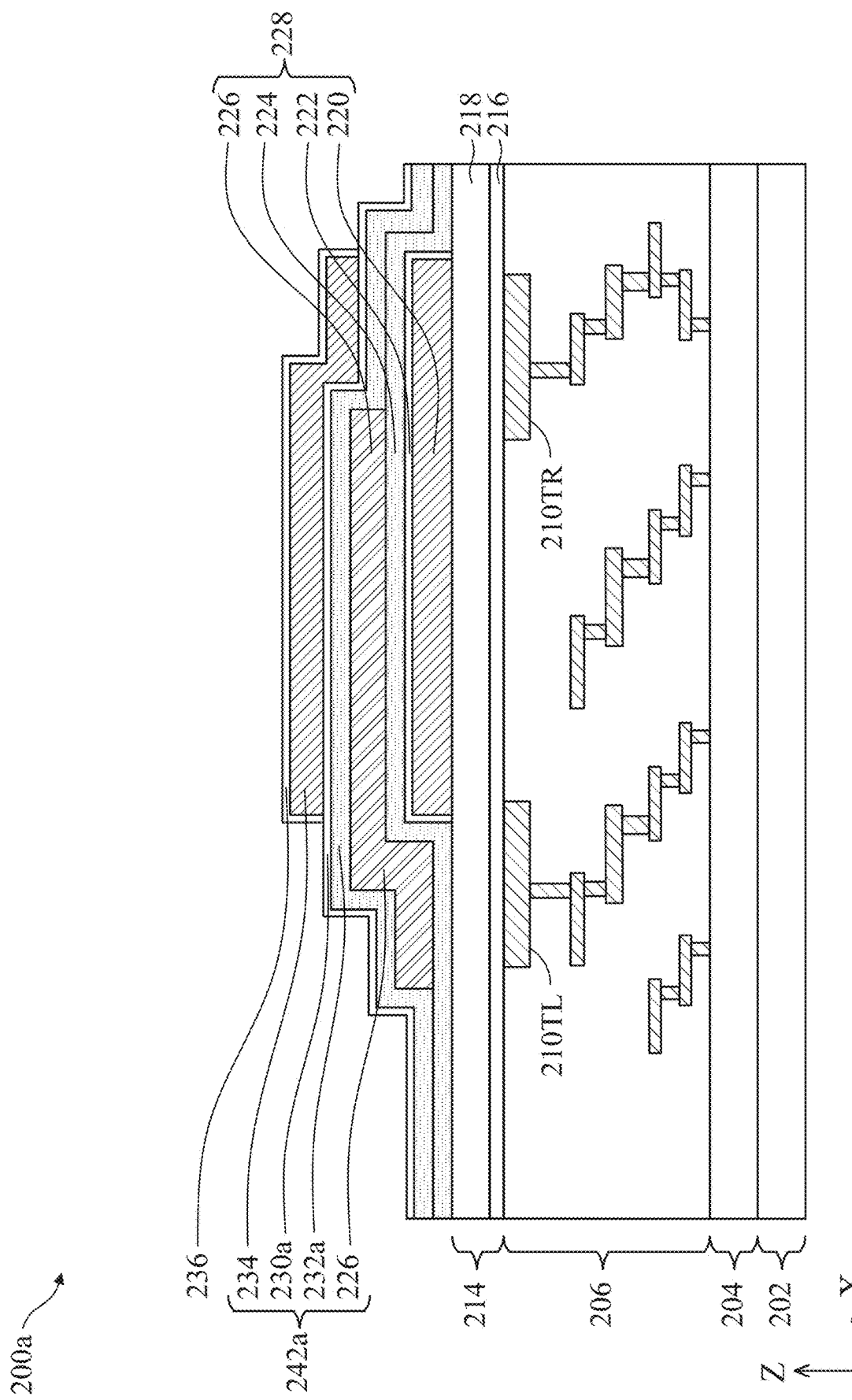
Figure 24:
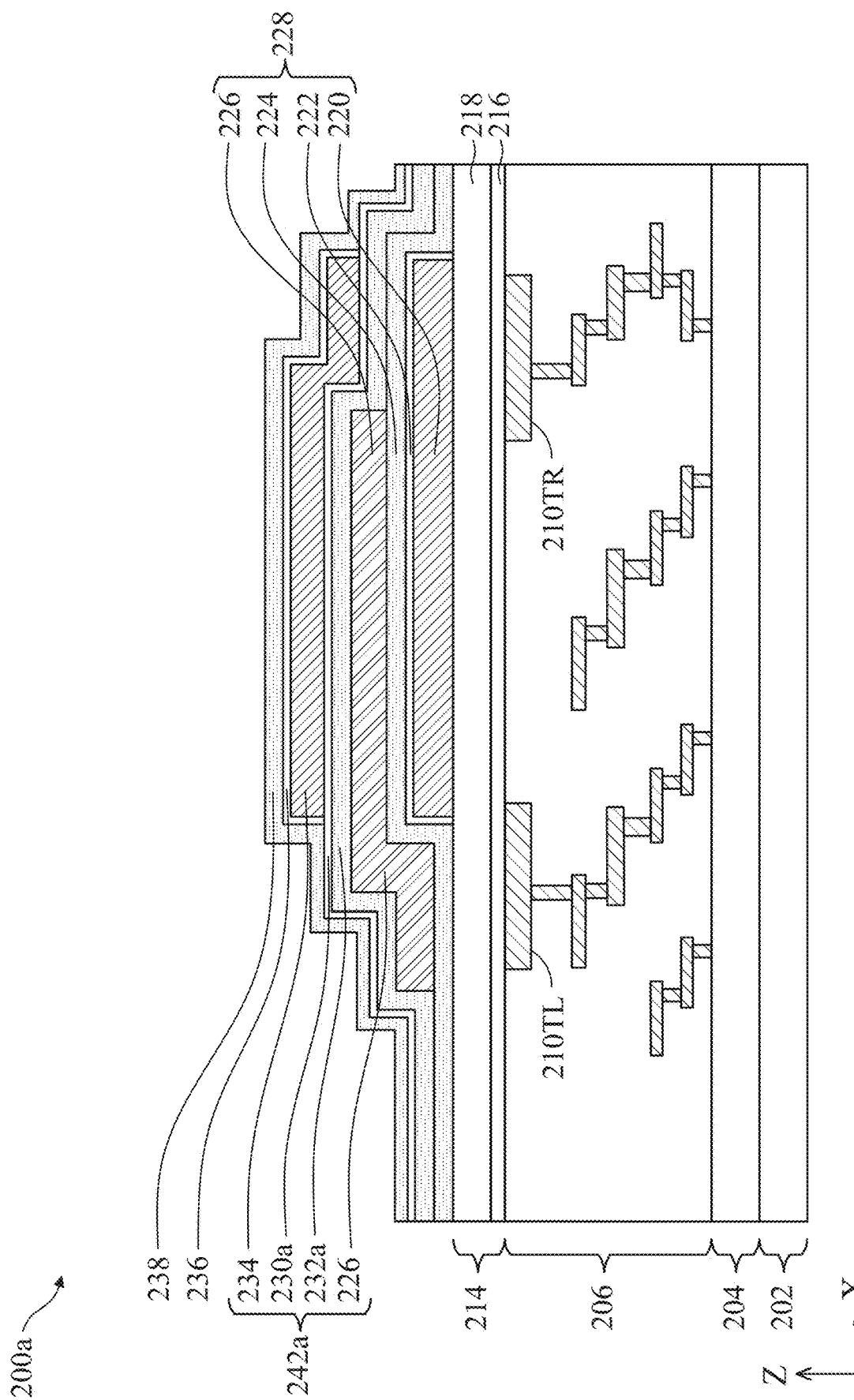
Figure 25:
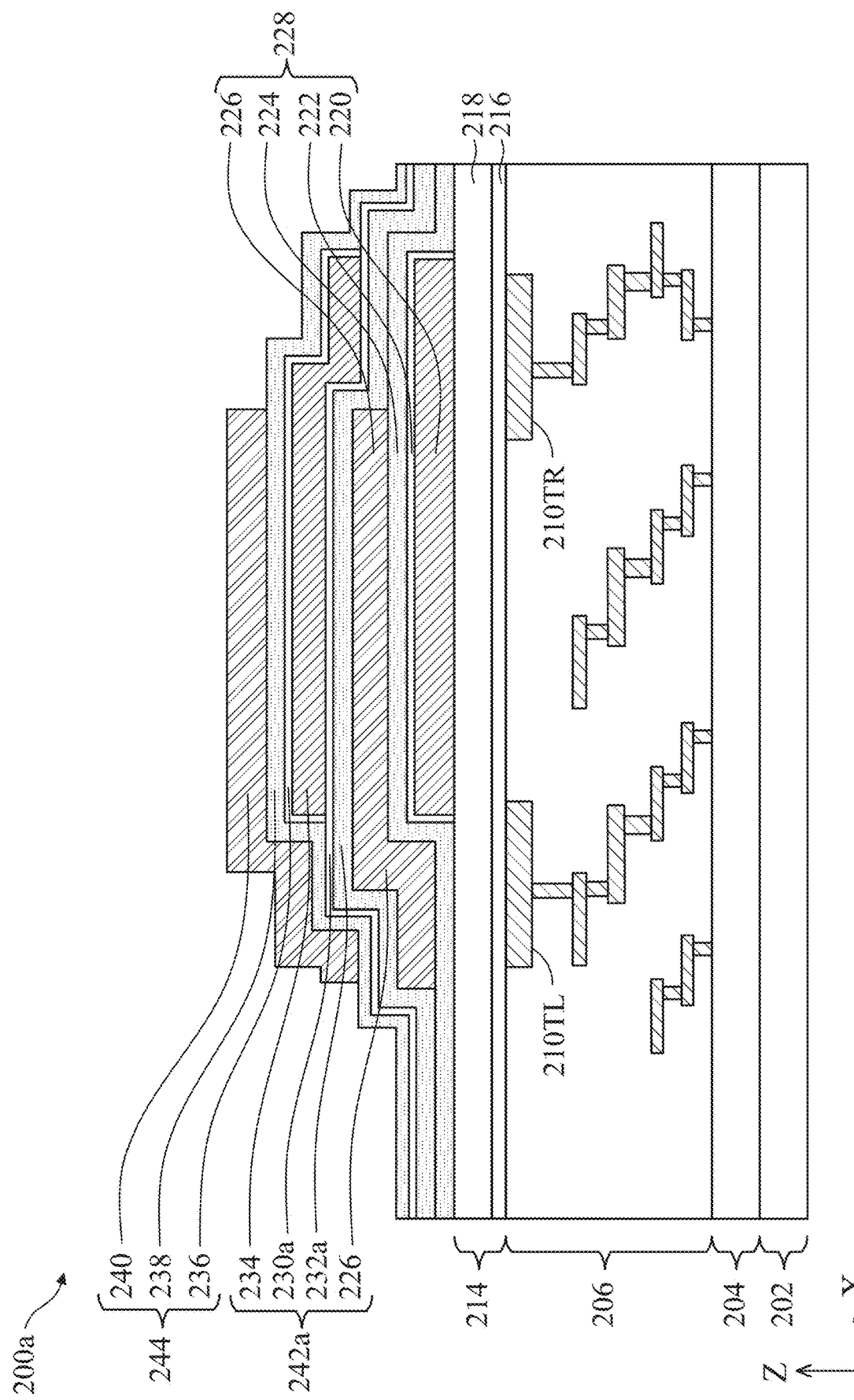

Operations 108, 110, 112 may be repeated to form the MIM capacitor 244 over the MIM capacitor 242 as shown in FIGS. 23-25. In FIG. 23, the straining layer 236 is on exposed surfaces of the third electrode 234 by performing operation 108. In FIG. 24, the high-k dielectric layer 238 is deposited over the straining layer 236 by performing operation 110. In FIG. 25, the fourth electrode 240 is formed on the high-k dielectric layer 238 by performing operation 112. At this stage, the third electrode 234, the straining layer 236, the high-k dielectric layer 238, and the fourth electrode 240 have formed the MIM capacitor 244.

After formation of the fourth electrode 240, operations 150 and 160 may be performed to seal and connect the MIM capacitors 228, 242a, 244. Alternatively, operations 114, 116, and 118 may be further repeated to form an another MIM capacitor similar to the MIM capacitor 242a.

Figure 26:
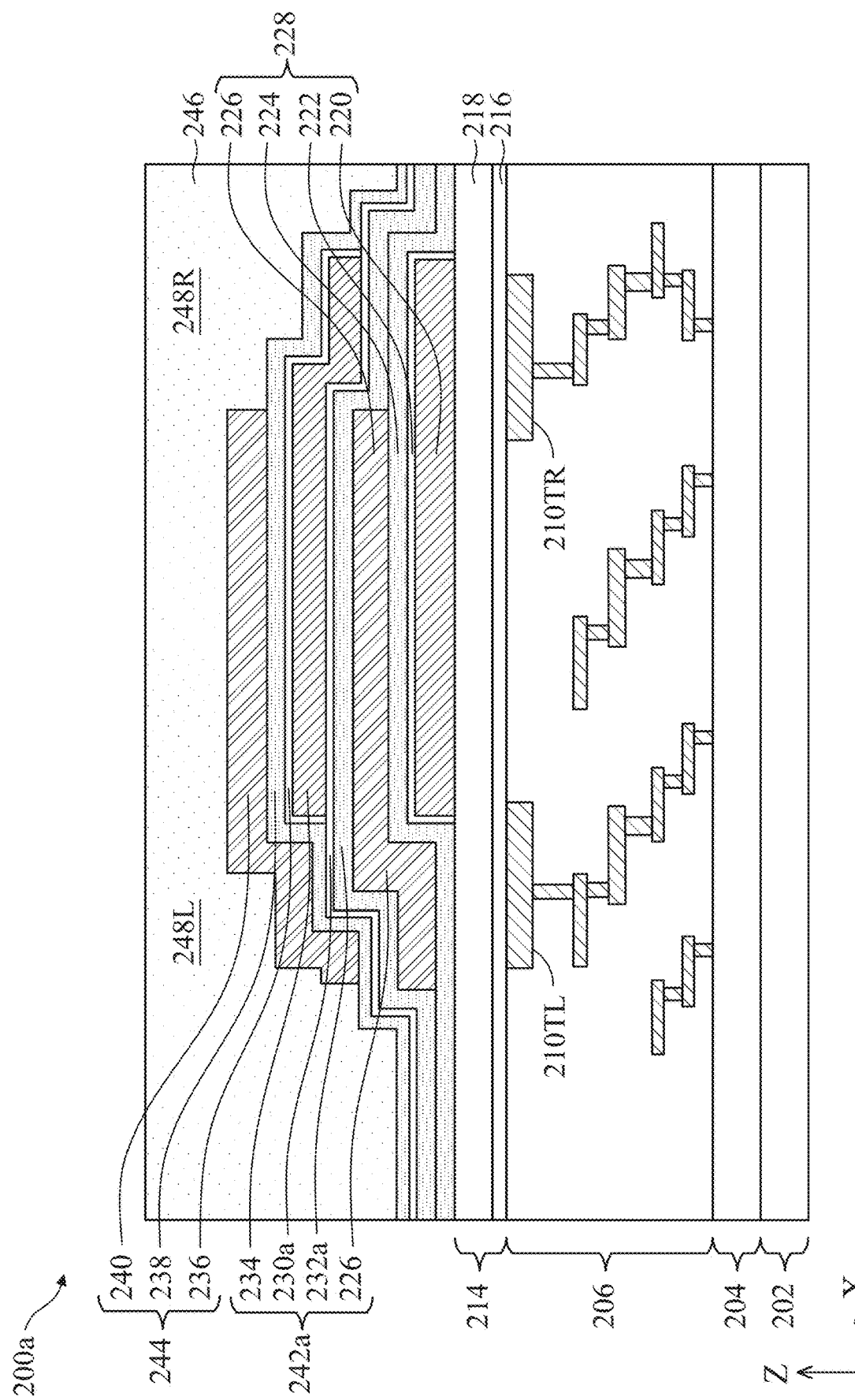
Figure 27A:
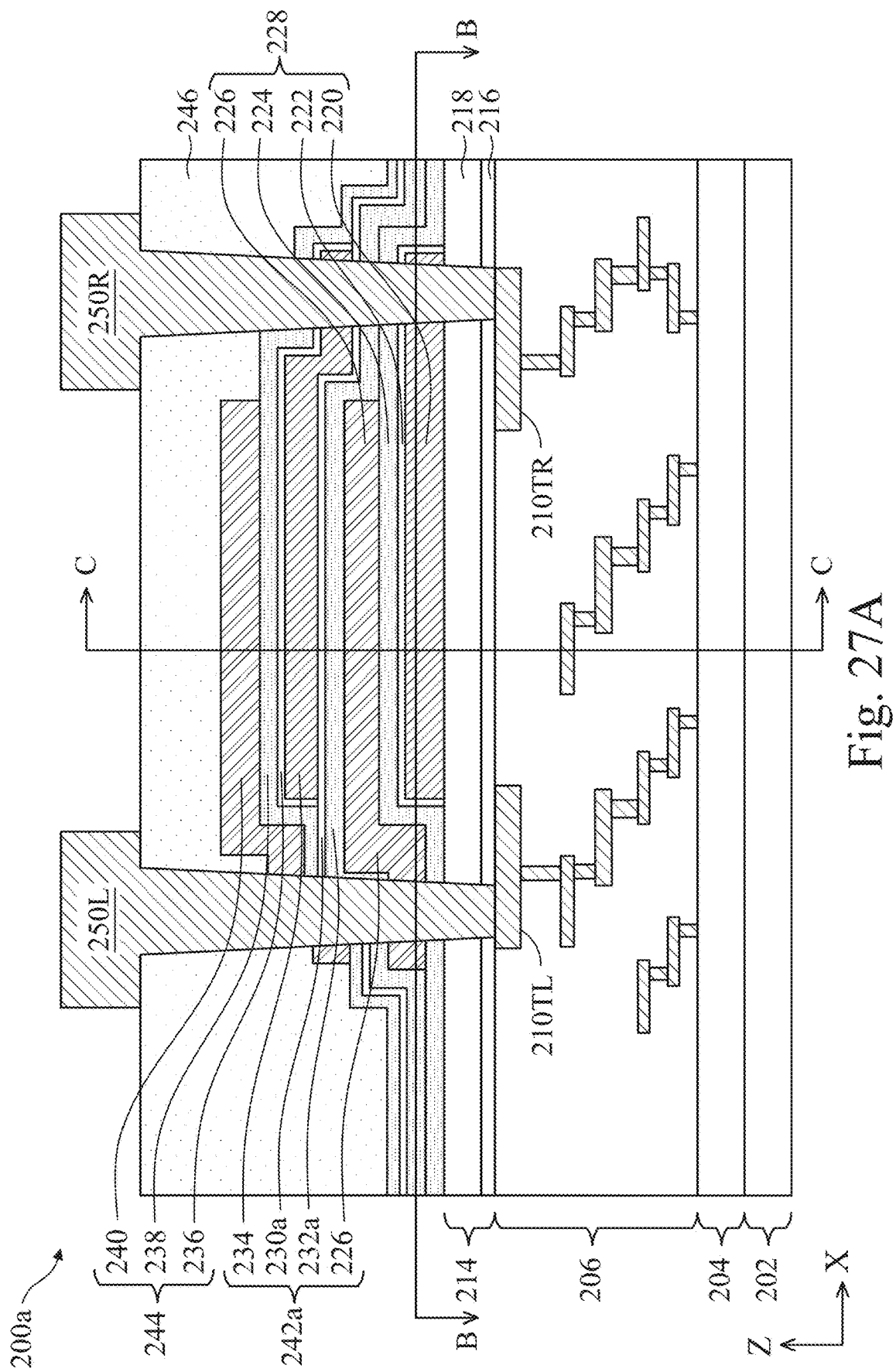
Figure 27B:
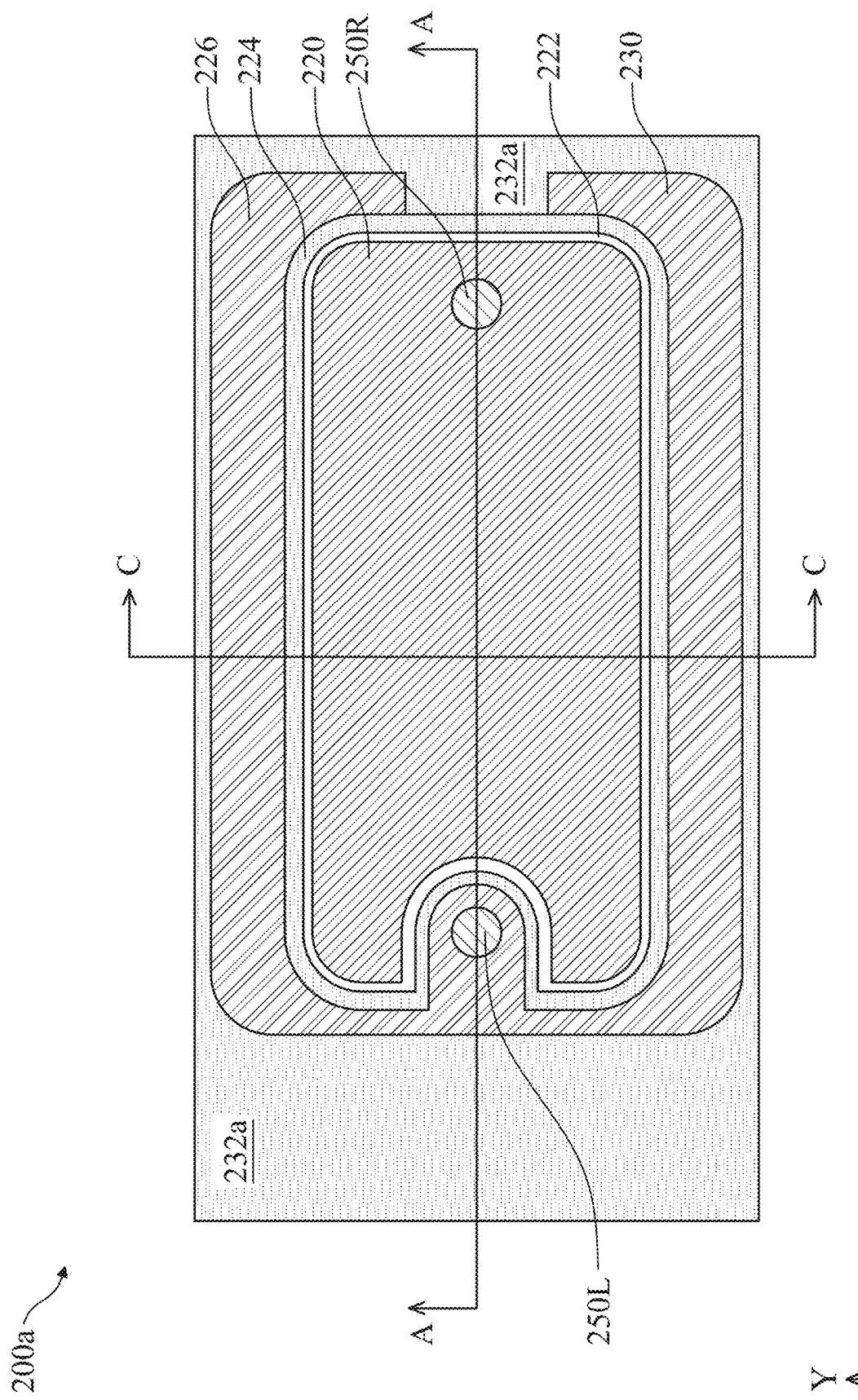
Figure 27C:
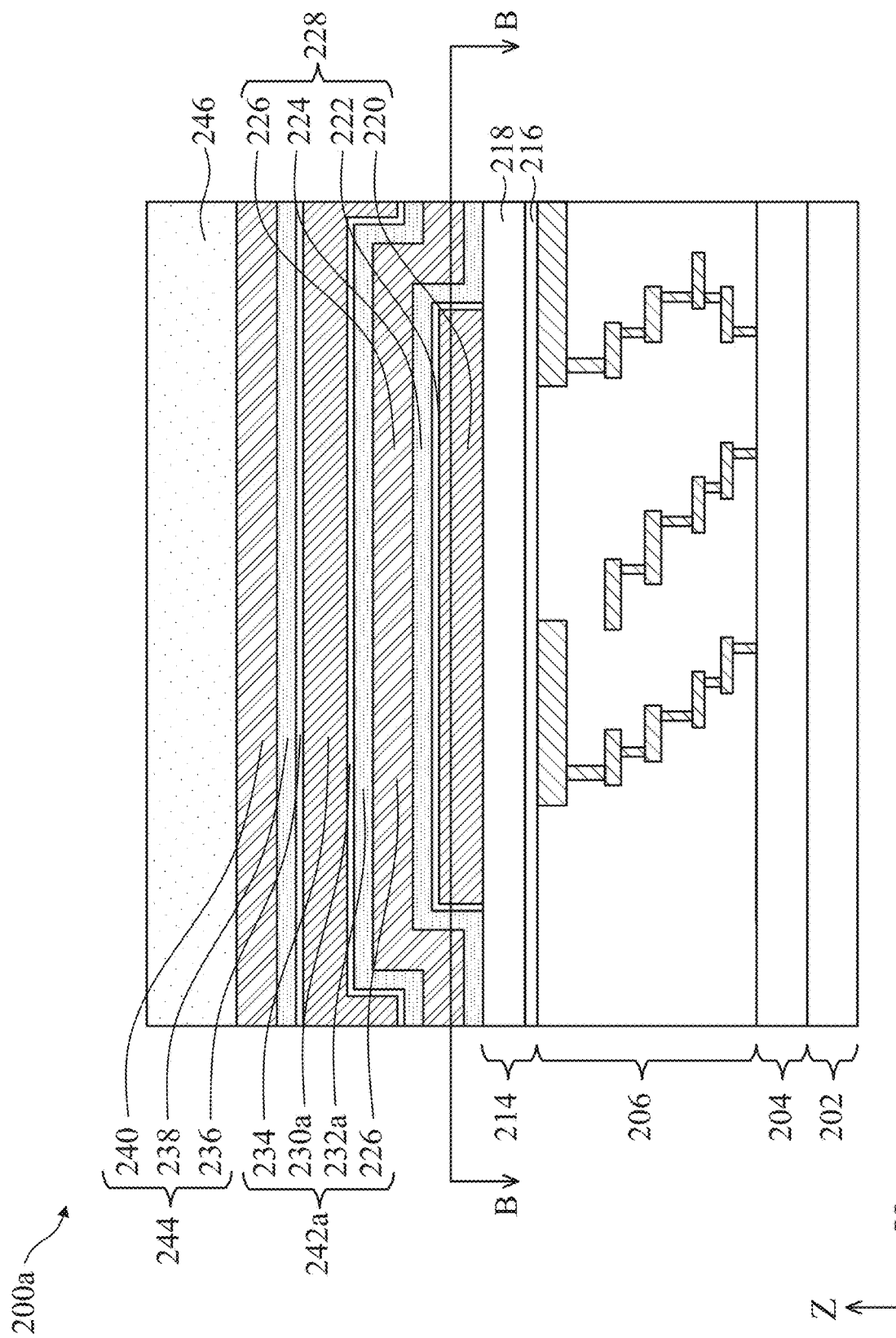

At operation 150, the dielectric layer %246% is formed to cover exposed portions of the MIM capacitors 228, 242a, 244, as shown in FIG. 26. At operation 160, the contact features 250L, 250R are formed to connect MIM capacitors 228, 242a, 244, as shown in FIGS. 27A-27C.

Figure 27D:
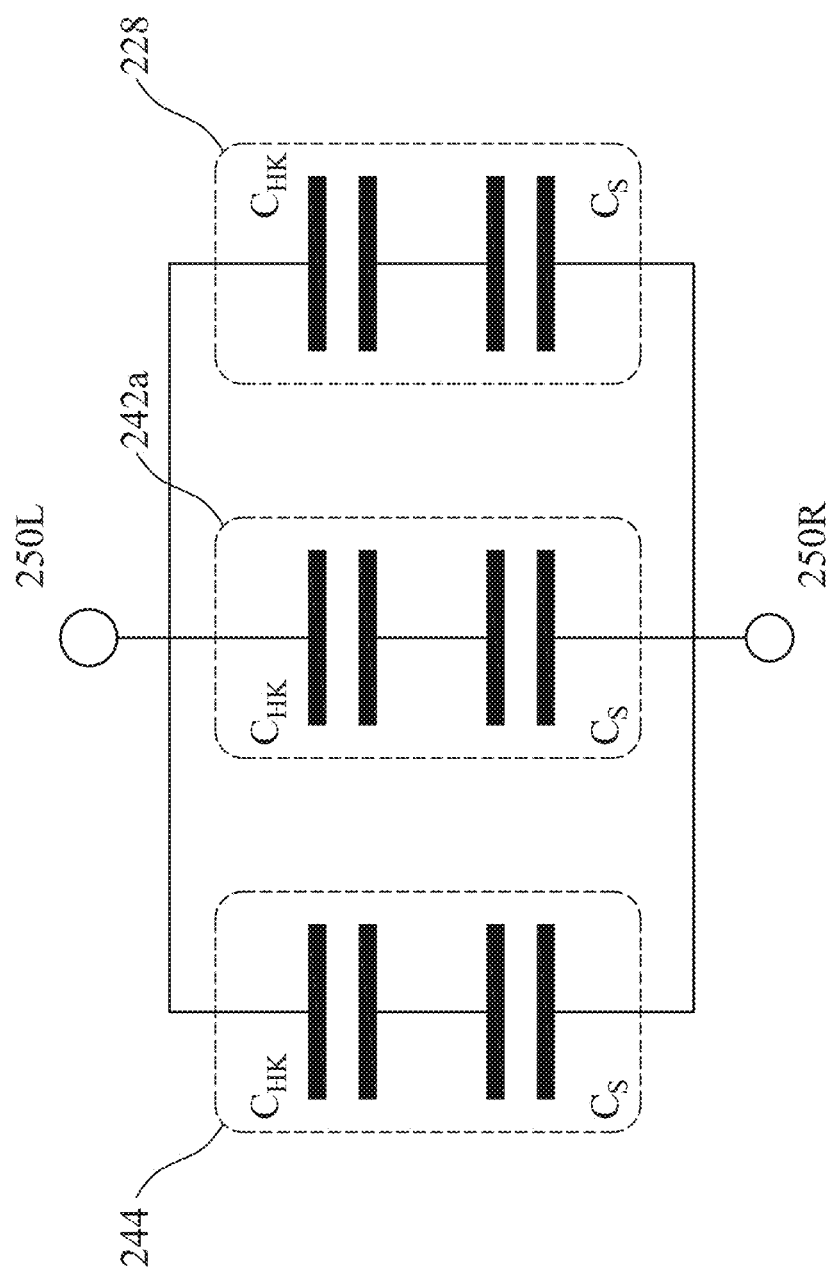
FIG. 27D is an equivalent circuit of the MIM capacitor device according to the present disclosure.

By switching the sequence of the high-k dielectric layer and the straining layer or the additional dielectric layer in neighboring stacked MIM capacitors, the MIM capacitors in the capacitor device 200a are symmetrically connected as shown in equivalent circuit in FIG. 27D. The MIM capacitors 228, 242a, 244 are parallelly connected between the contact features 250L, 250R. Each MIM capacitor 228, 242a, 244 includes two serially connected capacitors $C_s$ and $C_{HK}$. The capacitor $C_s$ is contributed by the straining layers 222, 230a, 236 and the capacitor $C_{HK}$ is contributed by the high-k dielectric layers 224, 232, 238. As shown in FIG. 27D, the stacked MIM capacitors 228, 242a, 244 symmetrically connected with respect to the contact features 250L, 250R. The symmetrical connection allows the capacitor device 200a to take full potential of the capacitors $C_s$ from the straining layers 222, 230a, 236.

Figure 27E:
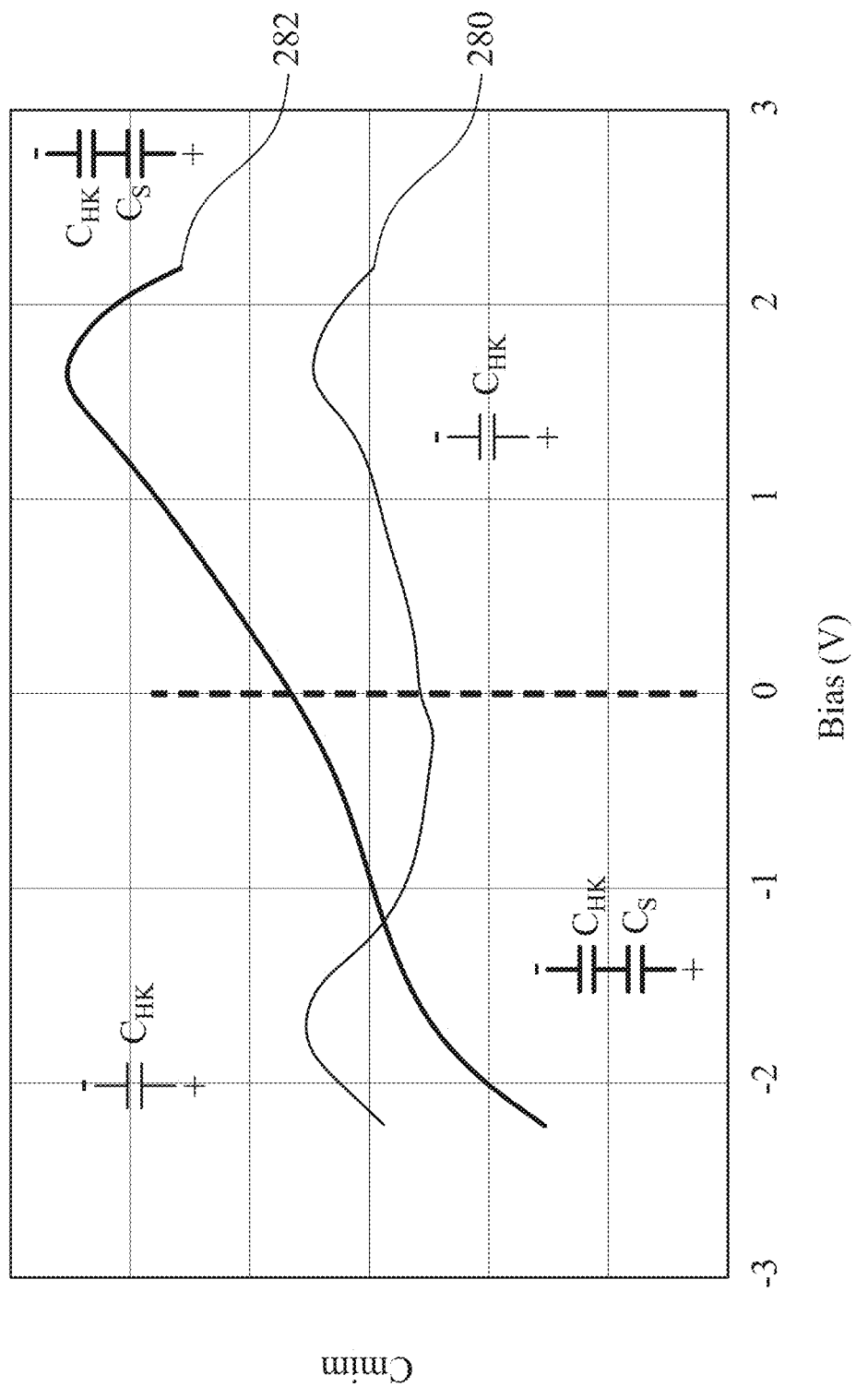
FIG. 27E includes two graphs showing effects of the straining layer on capacitance of a MIM capacitor according to the present disclosure.

FIG. 27E includes two graphs showing effects of the straining layer on capacitance of a MIM capacitor. The x-axis indicates a bias value applied on two electrodes of a MIM capacitor. The y-axis indicates the capacitance of the MIM capacitor. Curve 280 shows the relationship between capacitance and applied bias of a MIM capacitor having one high-k dielectric layer between two electrodes. As indicated by Curve 280, direction of the bias does not affect the capacitance of a MIM capacitor with on high-k dielectric layer. Curve 282 shows the relationship between capacitance and applied bias of a MIM capacitor having one high-k dielectric layer and one additional dielectric layer, such as the straining layer 222, 230, 238, between two electrodes. As indicated by Curve 282, the straining layer 222, 230, 238 increases the capacitance of the MIM capacitor when high voltage is applied to the electrode in contact with the straining layer and reduces the capacitance of the MIM capacitor when low voltage is applied to the electrode in contact with the straining layer. The arrangement in the capacitor device 200a may allow such MIM capacitors to receive bias from the same direction, therefore, to achieve increased capacitance by applying bias from the right direction.

Various embodiments or examples described herein offer multiple advantages over the state-of-art technology. By forming a straining layer on an electrode and then forming the high-k dielectric layer, the MIM capacitor according to the present disclosure improves capacitance density in the MIM capacitor. The straining layer formed on sidewalls of an electrode may also function as a spacer to prevent breakdown of the MIM capacitor. By alternate sequence of the straining layer and the high-k dielectric layer in stacked MIM capacitors, embodiments of the present disclosure further increase the capacitance of capacitive device.

Some embodiments of the present provide a method for fabricating a capacitor device, comprising: providing a substrate having first and second conductive features; depositing a first conductive layer on the substrate; patterning the first conductive layer to form a first electrode from the first conductive layer; treating the first electrode to form a first straining layer on the first electrode; depositing a first high-k dielectric layer on the first straining layer; depositing a second conductive layer on the first high-k dielectric layer; patterning the second conductive layer to form a second electrode from the second conductive layer; depositing a cover dielectric layer over the second electrode; forming first and second contact openings to expose the first and second conductive features respectively, wherein the first contact opening penetrates the first electrode, and second contact opening penetrates the second electrode; and filling the first and second contact openings with a conductive material Some embodiments of the present disclosure provide a capacitor device, comprising: a first electrode on a portion of a dielectric layer on a substrate, wherein the first electrode comprises a first material having columnar crystal grains and an intragranular strain greater than about 0_prd_5%; a first straining layer on the first electrode, wherein the first straining layer comprises crystal grains between boundaries of the columnar crystal grains of the first material; a first high-k dielectric layer on the first straining layer and the dielectric layer; and a second electrode on a portion of the first high-k dielectric layer.

Some embodiments of the present disclosure provide a metal-insulator-metal (MIM) capacitor device, comprising: a first electrode on a portion of a dielectric layer on a substrate, wherein the first electrode comprises a first material having a first thickness; a straining layer on the first electrode, wherein the first straining layer comprises an oxide of the first material having a second thickness, and a ratio of the second thickness over the first thickness is in range between 0.1 and 0.2; a first high-k dielectric layer on the first straining layer and the dielectric layer; and a second electrode on a portion of the first high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a capacitor device, comprising:
providing a substrate having first and second conductive features;
depositing a first conductive layer on the substrate;
patterning the first conductive layer to form a first electrode from the first conductive layer;
treating the first electrode to form a first straining layer on the first electrode, wherein the first electrode includes columnar crystal grains and treating the first electrode comprises increasing intragranular strain in the first electrode;
depositing a first high-k dielectric layer on the first straining layer;
depositing a second conductive layer on the first high-k dielectric layer;
patterning the second conductive layer to form a second electrode from the second conductive layer;
depositing a cover dielectric layer over the second electrode;
forming first and second contact openings to expose the first and second conductive features respectively, wherein the first contact opening penetrates the first electrode, and second contact opening penetrates the second electrode; and
filling the first and second contact openings with a conductive material.

2. The method of claim 1, wherein the first electrode has a degree of intragranular strain in a range between 0.5% and 1.0%.

3. The method of claim 1, wherein the first electrode includes a transitional metal nitride.

4. The method of claim 3, wherein the first straining layer comprises an oxide of the transitional metal nitride formed on a grain boundary of the transitional metal nitride.

5. The method of claim 1, further comprising, prior to depositing the cover dielectric layer,
forming a second straining layer on the second electrode;
depositing a second high-k dielectric layer on the second straining layer; and
forming a third electrode on the second high-k dielectric layer.

6. The method of claim 1, further comprising, prior to depositing the cover dielectric layer,
depositing a second high-k dielectric layer on the second electrode;
depositing an oxynitride containing layer on the second high-k dielectric layer; and
forming a third electrode on the oxynitride layer.

7. The method of claim 1, wherein the first straining layer comprises crystal grains between boundaries of the columnar crystal grains of the first electrode.

8. The method of claim 1, wherein the first straining layer includes a planar portion on a planar surface of the first electrode, and a sidewall portion on sidewalls of the first electrode.

9. A method, comprising:
forming a capacitor device comprising:
a first electrode on a portion of a dielectric layer on a substrate, wherein the first electrode comprises a first material having columnar crystal grains and an intragranular strain greater than about 0.5%;
a first straining layer on the first electrode, wherein the first straining layer comprises crystal grains between boundaries of the columnar crystal grains of the first material;
a first high-k dielectric layer on the first straining layer and the dielectric layer; and
a second electrode on a portion of the first high-k dielectric layer.

10. The method of claim 9, wherein the first straining layer comprises an oxide of the first material.

11. The method of claim 10, wherein the first material comprises a nitride of a transitional metal.

12. The method of claim 9, wherein the first straining layer includes a planar portion on a planar surface of the first electrode, and a sidewall portion on sidewalls of the first electrode.

13. The method of claim 9, further comprising:
forming a second straining layer on the second electrode;
depositing a second high-k dielectric layer on the second straining layer and the first high-k dielectric layer; and
forming a third electrode on the second high-k dielectric layer.

14. The method of claim 9, further comprising:
depositing a second high-k dielectric layer on the second electrode and the first high-k dielectric layer;
forming a second straining layer on the second high-k dielectric layer; and
depositing a third electrode on the second straining layer.

15. The method of claim 9, wherein the first material comprises a nitride of a transitional metal, and the first straining layer comprises an oxide of the first material.

16. A method, comprising, comprising:
forming a first electrode on a portion of a dielectric layer on a substrate, wherein the first electrode comprises a first material having a first thickness;
forming a straining layer on the first electrode, wherein the straining layer comprises an oxide of the first material having a second thickness, and a ratio of the second thickness over the first thickness is in range between 0.1 and 0.2;
depositing a first high-k dielectric layer on the straining layer and the dielectric layer; and
forming a second electrode on a portion of the first high-k dielectric layer, wherein the straining layer is formed on a top surface and sidewalls of the first electrode.

17. The method of claim 16, wherein the second electrode has a drop wall portion, and the sidewall portion of the straining layer is sandwiched between the drop wall portion of the second electrode and the sidewall of the first electrode.

18. The method of claim 16, further comprising:

depositing a second high-k dielectric layer in contact with the dielectric layer, wherein the dielectric layer and the straining layer have substantially the same composition, and the first electrode and the second high-k dielectric layer are on opposite sides of the dielectric layer; and forming a third electrode in contact with the second high-k dielectric layer.

19. The method of claim 16, wherein the first material has a degree of intragranular strain greater than 0.5%.

20. The method of claim 16, wherein the first straining layer comprises an oxynitride of a transitional metal.

* * * * *